US012075655B2

United States Patent
Cha et al.

(10) Patent No.: US 12,075,655 B2
(45) Date of Patent: Aug. 27, 2024

(54) ORGANIC LIGHT EMITTING DIODE DISPLAY DEVICE

(71) Applicant: SAMSUNG DISPLAY CO., LTD., Yongin-si (KR)

(72) Inventors: Myoung Geun Cha, Seoul (KR); Sang Gun Choi, Suwon-si (KR); Sang Sub Kim, Suwon-si (KR); Ji Yeong Shin, Busan (KR); Yong Su Lee, Seoul (KR); Ki Seok Choi, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/151,883

(22) Filed: Jan. 19, 2021

(65) Prior Publication Data

US 2021/0167153 A1 Jun. 3, 2021

Related U.S. Application Data

(62) Division of application No. 16/575,643, filed on Sep. 19, 2019, now Pat. No. 10,930,725.

(30) Foreign Application Priority Data

Feb. 8, 2019 (KR) .................. 10-2019-0015016

(51) Int. Cl.
*H01L 27/12* (2006.01)
*H10K 59/121* (2023.01)
(Continued)

(52) U.S. Cl.
CPC ..... *H10K 59/1213* (2023.02); *H10K 59/1216* (2023.02); *H10K 59/123* (2023.02); *H10K 59/124* (2023.02)

(58) Field of Classification Search
CPC ............ H01L 27/3262; H01L 27/3265; H01L 27/1225; H01L 27/1214; H10K 59/1213; H10K 59/1216
See application file for complete search history.

(56) References Cited

U.S. PATENT DOCUMENTS 8,455,876 B2    6/2013    Choi et al.
8,987,048 B2    3/2015    Yamazaki et al.
(Continued)

FOREIGN PATENT DOCUMENTS

JP         2017-208473      11/2017
KR    10-2012-0049886 A    5/2012
(Continued)

*Primary Examiner* — Michele Fan
(74) *Attorney, Agent, or Firm* — F. CHAU & ASSOCIATES, LLC

(57) ABSTRACT

An organic light emitting diode display includes a first thin film transistor of which a channel is formed in a polycrystalline transistor, a second thin film transistor of which a channel is formed in an oxide semiconductor layer, an organic light emitting diode electrically connected to the first thin film transistor, a storage capacitor having a first electrode and a second electrode, wherein the second electrode of the storage capacitor is electrically connected to a gate electrode of the first thin film transistor, and an overlapping layer overlapping the oxide semiconductor layer in a plan view and receiving a positive voltage. The oxide semiconductor layer is positioned higher than the gate electrode of the first thin film transistor and the second electrode of the storage capacitor.

8 Claims, 14 Drawing Sheets

(51) Int. Cl.
*H10K 59/123* (2023.01)
*H10K 59/124* (2023.01)

(56) References Cited

U.S. PATENT DOCUMENTS

| | | | |
|---|---|---|---|
| 9,184,185 | B2 | 11/2015 | Yamazaki et al. |
| 9,214,508 | B2 | 12/2015 | Cho et al. |
| 9,691,799 | B2 | 6/2017 | Lee et al. |
| 9,721,973 | B2 | 8/2017 | Lee et al. |
| 9,729,550 | B2 | 8/2017 | Kim et al. |
| 9,881,986 | B2 | 1/2018 | Cho et al. |
| 10,903,246 | B2 | 1/2021 | Lee et al. |
| 11,127,805 | B2 | 9/2021 | Kim et al. |
| 2011/0003430 | A1 | 1/2011 | Yamazaki et al. |
| 2011/0012117 | A1* | 1/2011 | Yamazaki ........... H01L 27/1262 257/E27.111 |
| 2011/0024750 | A1 | 2/2011 | Yamazaki et al. |
| 2011/0068388 | A1 | 3/2011 | Yamazaki et al. |
| 2011/0090184 | A1 | 4/2011 | Yamazaki et al. |
| 2016/0189605 | A1* | 6/2016 | Ahn ..................... G09G 3/3225 345/76 |
| 2020/0258968 | A1 | 8/2020 | Cha et al. |
| 2021/0359063 | A1 | 11/2021 | Lu et al. |
| 2022/0005907 | A1 | 1/2022 | Kim et al. |

FOREIGN PATENT DOCUMENTS

| | | |
|---|---|---|
| KR | 10-2015-0101395 A | 9/2015 |
| KR | 10-2015-0101409 | 9/2015 |
| KR | 10-2015-0101416 | 9/2015 |
| KR | 10-2018-0119192 | 11/2018 |
| KR | 10-2018-0133280 A | 12/2018 |

* cited by examiner

ORGANIC LIGHT EMITTING DIODE DISPLAY DEVICE

CROSS-REFERENCE TO RELATED APPLICATION

This application is a divisional of U.S. application Ser. No. 16/575,643, filed on Sep. 19, 2019, which claims priority under 35 U.S.C. 119 to Korean Patent Application No. 10-2019-0015016 filed in the Korean Intellectual Property Office on Feb. 8, 2019, the disclosure of which is incorporated by reference herein in its entirety.

BACKGROUND

(a) Field

The present invention relates to an organic light emitting diode display, and more particularly, to an organic light emitting diode display including transistors using different semiconductor layers.

(b) Description of the Related Art

Recently, organic light emitting diode displays have attracted attention as a device for displaying an image.

Since the organic light emitting diode displays are self-emissive without a light source, unlike a liquid crystal display device, it is possible to reduce thickness and weight. Further, the organic light emitting diode displays have high-quality characteristics such as low power consumption, high luminance, and high response speed.

Generally, the organic light emitting diode displays include a substrate, a plurality of thin film transistors disposed on the substrate, a plurality of insulating films disposed between wires for configuring the thin film transistors, and an organic light emitting diode (OLED) connected to the thin film transistor. Particularly, at least two or more thin film transistors are used in order to allow one organic light emitting diode (OLED) to emit light.

The above information disclosed in this Background section is only for enhancement of understanding of the background of the invention, and therefore it may contain information that does not form the prior art that is already known in this country to a person of ordinary skill in the art.

SUMMARY

The present embodiments have been made to improve display quality of the organic light emitting diode display by that some of a plurality of transistors used for driving one organic light emitting diode (OLED) improve reliability of those transistors and/or by that the other transistors remove a leakage current of those transistors. In addition, the present embodiments have been made in an effort to provide an organic light emitting diode display that may stabilize characteristics of a transistor using an oxide semiconductor. Further, the present embodiments have been made in an effort to provide an organic light emitting diode display that may have such a structure, which is required to form the organic light emitting diode display, without increasing the number of processes.

According to an exemplary embodiment of the present invention, an organic light emitting diode display includes a substrate, a polycrystalline semiconductor layer disposed on the substrate, a first insulating film covering the polycrystalline semiconductor layer, a first conductor disposed on the first insulating film, a second insulating film covering the first conductor and the first insulating film, a second conductor disposed on the second insulating film, a third insulating film covering the second insulating film and the second conductor, an oxide semiconductor layer disposed on the third insulating film, a fourth insulating film covering the oxide semiconductor layer and the third insulating film, a third conductor disposed on the fourth insulating film, an fifth insulating film covering the third conductor and the fourth insulating film, a fourth conductor disposed on the fifth insulating film, and a passivation covering the fourth conductor and the fifth insulating film. The first conductor includes a gate electrode of a driving transistor that overlaps the polycrystalline semiconductor layer to form the driving transistor, and the second conductor includes a storage electrode overlapping the driving gate electrode and an overlapping layer overlapping the oxide semiconductor layer.

According to an exemplary embodiment of the present invention, an organic light emitting diode display includes a first thin film transistor of which a channel is formed in a polycrystalline transistor, a second thin film transistor of which a channel is formed in an oxide semiconductor layer, an organic light emitting diode electrically connected to the first thin film transistor, a storage capacitor having a first electrode and a second electrode, wherein the second electrode of the storage capacitor is electrically connected to a gate electrode of the first thin film transistor, and an overlapping layer overlapping the oxide semiconductor layer in a plan view and receiving a positive voltage. The oxide semiconductor layer is positioned higher than the gate electrode of the first thin film transistor and the second electrode of the storage capacitor.

DETAILED DESCRIPTION OF THE EMBODIMENTS

Figure 1:
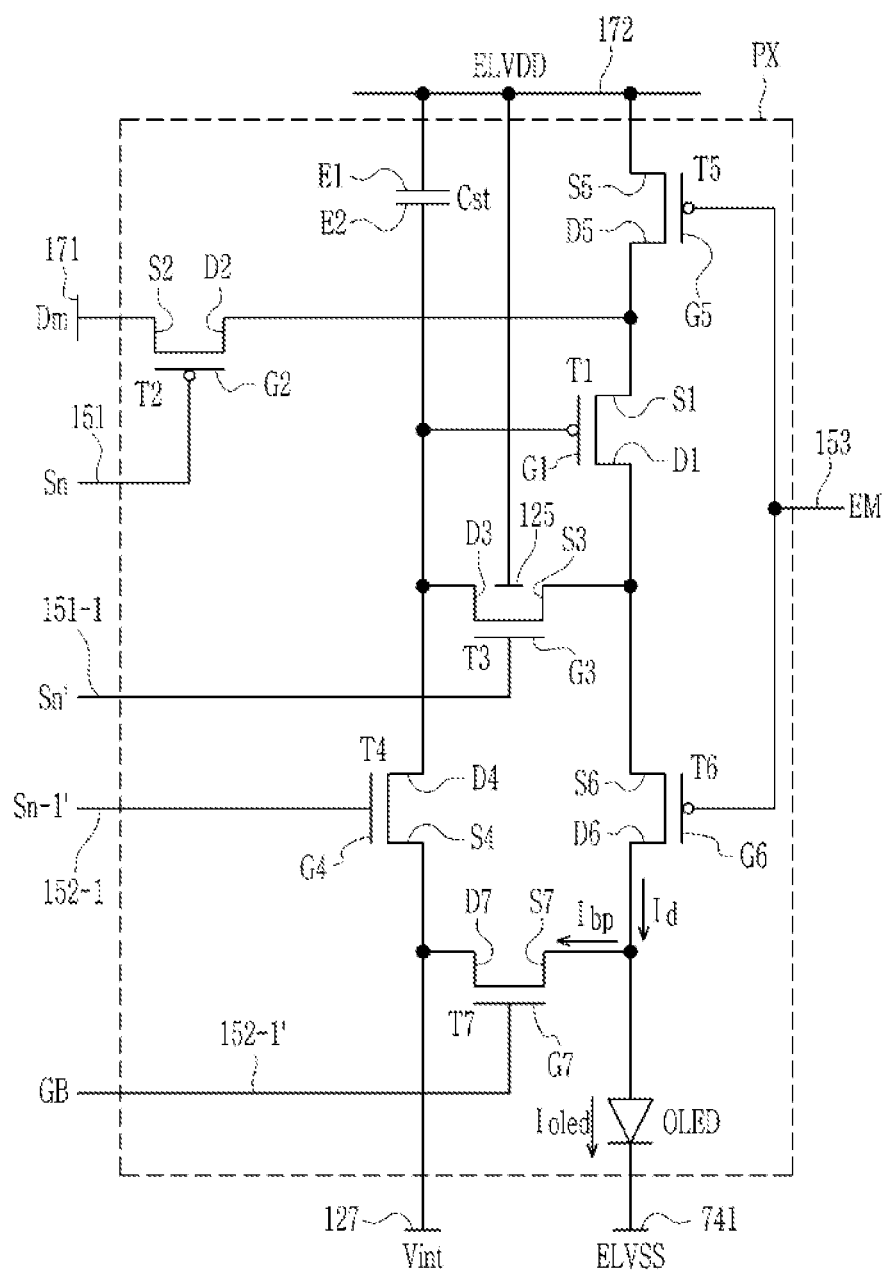
FIG. 1 illustrates an equivalent circuit diagram of one pixel of an organic light emitting diode display according to an embodiment.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present disclosure.

Parts that are irrelevant to the description will be omitted to clearly describe the present disclosure, and like reference numerals designate like elements throughout the specification.

Further, in the drawings, the size and thickness of each element are arbitrarily illustrated for ease of description, and the present disclosure is not necessarily limited to those illustrated in the drawings. In the drawings, the thicknesses of layers, films, panels, regions, etc., are exaggerated for clarity. In the drawings, for ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Further, throughout the specification, the phrase "on a plane" means viewing a target portion from the top, and the phrase "on a cross-section" means viewing a cross-section formed by vertically cutting a target portion from the side.

Hereinafter, an organic light emitting diode display according to an embodiment will be described with reference to FIG. 1 and FIG. 2.

Figure 2:
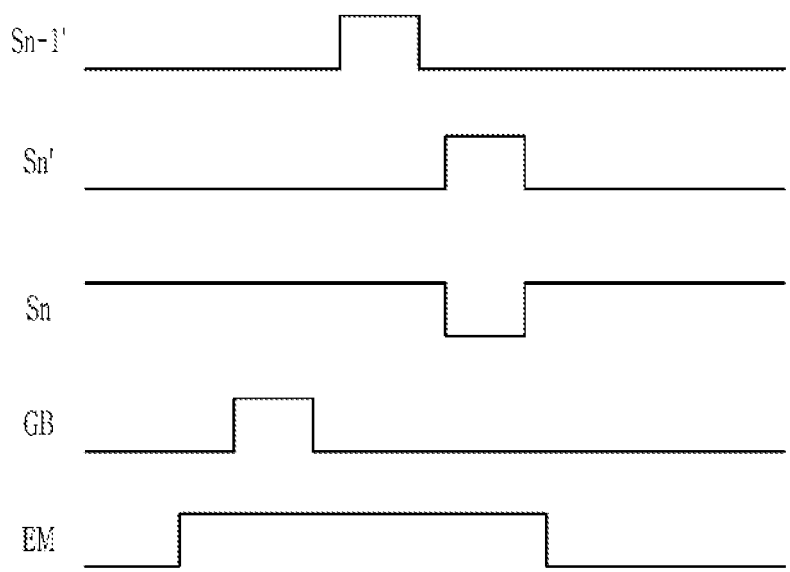
FIG. 2 illustrates a timing chart of a signal applied to one pixel of an organic light emitting diode display according to an embodiment.

FIG. 1 illustrates an equivalent circuit diagram of one pixel of an organic light emitting diode display according to an embodiment, and FIG. 2 illustrates a timing chart of a signal applied to one pixel of an organic light emitting diode display according to an embodiment.

First, referring to FIG. 1, a pixel PX of the organic light emitting diode display includes a plurality of transistors T1, T2, T3, T4, T5, T6, and T7 connected to a plurality of signal lines 127, 151, 151-1, 152-1, 152-1', 153, 171, 172, and 741, a storage capacitor Cst, and an organic light emitting diode OLED.

In addition, the pixel shown in FIG. 1, which is one embodiment, further includes an overlapping layer 125. The overlapping layer 125 is disposed below a semiconductor layer of the third transistor T3 to overlap the semiconductor layer of the third transistor T3 in a plan view. Here, the semiconductor layer of the third transistor T3 is formed of an oxide semiconductor. That is, the overlapping layer 125 is disposed between a substrate 110 and an oxide semiconductor layer of the third transistor T3. (See FIG. 4)

In addition, the overlapping layer 125 is electrically connected to a protruding portion 172-1 of the driving voltage line 172 to which a driving voltage ELVDD is transmitted, through an opening 66. According to embodiments, the opening 66 and the protruding portion 172-1 of the driving voltage line 172 may be disposed in the pixel PX or in a pixel adjacent to the pixel PX. The overlapping layer 125 may be made of metal having a conductive property, and in the present embodiment, the overlapping layer 125 may be made of the same material as one of two storage electrodes of the storage capacitor Cst.

Although the driving voltage ELVDD is applied to the overlapping layer 125 of FIG. 1, the present invention is not limited thereto, and a positive voltage may be applied thereto due to the characteristics of the oxide semiconductor. According to a voltage applied to the overlapping layer 125, a threshold voltage Vth of a channel of the third transistor T3 which overlaps the overlapping layer 125 may be shifted, a leakage current may be reduced, and the characteristics of the third transistor T3 may be stabilized. Here, since the semiconductor layer of the third transistor T3 is made of an oxide semiconductor, the third transistor T3 has an n-type transistor characteristic, and is turned on when a high voltage is applied to a gate electrode G3.

In the organic light emitting diode display according to the embodiment, one pixel PX is configured as in the circuit diagram shown in FIG. 1, and a plurality of pixels are arranged in various forms such as a matrix form.

At least one of the plurality of transistors T1, T2, T3, T4, T5, T6, and T7 included in the pixel PX may include semiconductor layers formed of an oxide semiconductor as in the third transistor T3 and may serve as an n-type transistor, and the remaining transistors may include semiconductor layers formed of a polycrystalline semiconductor as in the driving transistor T1 and may serve as a p-type transistor. Hereinafter, a transistor group of an n-type transistor will be referred to as a 'switching transistor group', and a transistor group of a p-type transistor will be referred to as a 'driving transistor group'.

Since a leakage current occurs in the n-type transistor, in the present embodiments, a positive voltage is applied to the overlapping layer 125 and then a voltage of the oxide semiconductor layer is stabilized and an operation of the switching transistor is also compensated. In the present embodiment, only the third transistor T3 among the transistors of the switching transistor group includes the overlapping layer 125. In the embodiment of FIG. 1, the switching transistor group includes the third transistor T3, the fourth transistor T4, and the seventh transistor T7.

On the other hand, the p-type transistor has excellent reliability, and relates a basic operation of the driving transistor T1, that is, outputting a driving current. This secures reliability by using a polycrystalline semiconductor as a semiconductor layer. In the embodiment of FIG. 1, the driving transistor group includes the driving transistor T1, the second transistor T2, the fifth transistor T5, and the seventh transistor T7.

In some embodiments, the transistors included in the switching transistor group and the transistors included in the driving transistor group may be changed.

The plurality of signal lines 127, 151, 151-1, 152-1, 152-1', 153, 171, 172, and 741 may include a scan line 151, a main inversion scan line 151-1, a previous inversion scan line 152-1, a light emission control line 153, a bypass control line 152-1', a data line 171, the driving voltage line 172, an initializing voltage line 127, and a common voltage line 741. The bypass control line 152-1' in the present embodiment may be electrically connected to a previous inversion scan line of the previous pixel.

The scan line 151 is connected to a gate driving portion (not shown) to transmit a scan signal Sn to the second transistor T2.

Although the main inversion scan line 151-1 has the same timing as a signal of the scan line 151, they may have opposite voltage levels. For example, when a high voltage is applied to the scan line 151, a low voltage is applied to the main inversion scan line 151-1, and when a low voltage is applied to the scan line 151, a high voltage is applied to the main inversion scan line 151-1, and hereinafter, this is simply referred to as inversion. When the scan line 151 transmits the scan signal Sn to the second transistor, the main inversion scan line 151-1 transmits an inversion scan signal Sn', an inverted signal of the scan signal Sn, to the third transistor T3.

The previous inversion scan line 152-1 is connected to the gate driving portion to transmit an inverted signal Sn−1' (which is also referred to as a previous inversion scan signal) of a line scan signal Sn−1 applied to the pixel PX disposed at a previous stage to the fourth transistor T4.

The light emission control line 153 is connected to a light emission control portion (not shown) to transmit a light emission control signal EM for controlling a light emission time of the organic light emitting diode OLED to the fifth transistor T5 and the sixth transistor T6.

The bypass control line 152-1' transmits a bypass signal GB to the seventh transistor T7, and referring to FIG. 2, it transmits an inversion signal (hereinafter referred to as a previous-previous inversion signal) of a signal preceding the line scan signal Sn−1 to the seventh transistor T7.

The data line 171 is a wire for transmitting a data voltage Dm generated by a data driving portion (not shown), and luminance at which the organic light emitting diode OLED emits light may be changed according to the data voltage Dm applied to the pixel PX.

The driving voltage line 172 applies the driving voltage ELVDD, the initializing voltage line 127 transmits an initializing voltage Vint for initializing a gate electrode G1 of the driving transistor T1 and an anode of the organic light emitting diode OLED, and the common voltage line 741 transmits a common voltage Vcom to a cathode of the organic light emitting diode OLED. The voltages applied to the driving voltage line 172, the initializing voltage line 127, and the common voltage line 741 may be constant. In an example embodiment, the driving voltage line 172 may be electrically connected to a driving voltage source supplying the driving voltage ELVDD. For example, the driving voltage source may include a voltage generator or a voltage converter.

Hereinafter, a plurality of transistors will be described in detail.

First, the driving transistor T1 is formed as a p-type transistor, has a semiconductor layer of a polycrystalline semiconductor, and controls an amount of a current outputted to the anode electrode of the organic light emitting diode OLED in accordance with the data voltage Dm applied to the gate electrode G1 of the driving transistor T1 (hereinafter also referred to as a gate electrode of the driving transistor). Brightness of the organic light emitting diode OLED is controlled in accordance with an amount of a driving current Id outputted to the anode of the organic light emitting diode OLED, thus luminance of the organic light emitting diode OLED may be controlled according to the data voltage Dm applied to the pixel PX. For this, in the embodiment of FIG. 1, a first electrode S1 (an input side electrode) of the driving transistor T1 is disposed to receive the driving voltage ELVDD, and is connected to the driving voltage line 172 via the fifth transistor T5. In addition, the first electrode S1 of the driving transistor T1 is connected to a second electrode D2 of the second transistor T2 to receive the data voltage Dm. A second electrode D1 is disposed to output a current toward the organic light emitting diode OLED, and is connected to the anode of the organic light emitting diode OLED via the sixth transistor T6. In addition, the second electrode D1 transmits the data voltage Dm applied to the first electrode S1 to the third transistor T3. An operation of transmitting the data voltage Dm to the third transistor T3 by the driving transistor T1 and an operation of transmitting the output current to the organic light emitting diode OLED are performed in different periods. On the other hand, the gate electrode G1 is connected to one electrode (second storage electrode E2) of the storage capacitor Cst. Accordingly, a voltage of the gate electrode G1 varies depending on a voltage stored in the storage capacitor Cst, thus the driving current Id outputted by the driving transistor T1 varies. In addition, the storage capacitor Cst may serve to maintain a voltage of the gate electrode G1 of the driving transistor T1 to be constant during one frame.

The driving transistor T2 is formed as a p-type transistor, has a semiconductor layer of a polycrystalline semiconductor, and receives the data voltage Dm for the pixel PX. The driving transistor T2 has a gate electrode G2 connected to the scan line 151, and a first electrode S2 connected to the data line 171. The second electrode D2 of the second transistor T2 is connected to the first electrode S1 of the driving transistor T1. When the second transistor T2 is turned on in response to a low voltage of the first scan signal Sn transmitted through the scan line 151, the data voltage Dm transmitted through the data line 171 is transmitted to the first electrode S1 of the driving transistor T1.

The driving transistor T3 is formed as an n-type transistor, has a semiconductor layer formed of an oxide semiconductor, and electrically connects the second electrode D1 and the gate electrode G1 of the driving transistor T1. As a result, the driving transistor T3 causes a compensation voltage (voltage of Dm+Vth) to be changed while the data voltage Dm passes through the driving transistor T1 to be transferred to the second storage electrode E2 of the storage capacitor Cst. The gate electrode G3 is connected to the main inversion scan line 151-1, and a first electrode S3 is connected to the second electrode D1 of the driving transistor T1. A second electrode D3 of the third transistor T3 is connected to the second storage electrode E2 of the storage capacitor Cst and the gate electrode G1 of the driving transistor T1. The third transistor T3 is turned on by a high voltage of the inversion scan signal Sn' transmitted through the main inversion scan line 151-1 to connect the gate electrode G1 and the second electrode D1 of the driving transistor T1, and to transmit the voltage applied to the gate electrode G1 of the driving transistor T1 to the second storage electrode E2 of the storage capacitor Cst so that the voltage applied to the gate electrode G1 is stored in the storage capacitor Cst.

The third transistor T3 further includes the overlapping layer 125 disposed below the oxide semiconductor layer to compensate the characteristics of the semiconductor layer made of the oxide semiconductor. In the embodiment of FIG. 1, the driving voltage ELVDD is applied to the overlapping layer 125. By applying the driving voltage ELVDD to the overlapping layer 125, it is possible to prevent a potential of the overlapping layer 125 itself from being changed and to prevent the voltage of the oxide semiconductor layer of the third transistor T3 from being easily changed. As a result, a leakage current problem that may occur in the third transistor T3 is solved, thus it may stably operate.

The fourth transistor T4 is formed as an n-type transistor, has a semiconductor layer formed of an oxide semiconductor, and serves to initialize the gate electrode G1 of the driving transistor T1 and the second storage electrode E2 of the storage capacitor Cst. A gate electrode G4 is connected to the previous inversion scan line 152-1, and a first electrode S4 is connected to the initializing voltage line 127. A second electrode D4 of the fourth transistor T4 is connected to the second storage electrode E2 of the storage capacitor Cst, the gate electrode G1 of the driving transistor T1 and the second electrode D3 of the third transistor T3. The fourth transistor T4 is turned on by a high voltage of the previous inversion scan signal Sn−1' transmitted through the previous inversion scan line 152-1 to transmit the initializing voltage Vint to the gate electrode G1 of the driving transistor T1 and the second storage electrode E2 of the storage capacitor Cst. Thus, a gate voltage of the gate electrode G1 of the driving transistor T1 and the storage capacitor Cst are initialized. The initializing voltage Vint has a low voltage value, which may be a voltage capable of turning on the driving transistor T1.

The fifth transistor T5 is formed as a p-type transistor, has a semiconductor layer formed of a polycrystalline semiconductor, and serves to transmit the driving voltage ELVDD to the driving transistor T1. A gate electrode G5 is connected to the light emission control line 153, and a first electrode S5 is connected to the driving voltage line 172. A second electrode D5 of the fifth transistor T5 is connected to the first electrode S1 of the driving transistor T1.

The sixth transistor T6, like the fifth transistor T5, is formed as a p-type transistor, has a semiconductor layer formed of a polycrystalline semiconductor, and serves to transmit a driving current Id outputted from the driving transistor T1 to the organic light emitting diode OLED. A gate electrode G6 is connected to the light emission control line 153, and a first electrode S6 is connected to the second electrode D1 of the driving transistor T1. A second electrode D6 of the sixth transistor T6 is connected to the anode of the organic light emitting diode OLED.

The fifth transistor T5 and the sixth transistor T6 are simultaneously turned on by a low voltage of the light emission control signal EM transmitted through the light emission control line 153, and when the driving voltage ELVDD is applied to the first electrode S1 of the driving transistor T1 through the fifth transistor T5, the driving transistor T1 outputs the driving current Id according to a voltage (i.e., a voltage of the second storage electrode E2 of the storage capacitor Cst) of the gate electrode G1 of the driving transistor T1. The outputted driving current Id is transmitted to the organic light emitting diode OLED through the sixth transistor T6. The organic light emitting diode OLED emits light as a current Ioled flows through the organic light emitting diode OLED.

The seventh transistor T7 is formed as an n-type transistor, has a semiconductor layer formed of an oxide semiconductor, and serves to initialize the anode of the organic light emitting diode OLED. A gate electrode G7 of the seventh transistor T7 is connected to the bypass control line 152-1', a first electrode S7 of the seventh transistor T7 is connected to the anode of the organic light emitting diode OLED, and a second electrode D7 of the seventh transistor T7 is connected to the initializing voltage line 127. The bypass control line 152-1' may be connected to the previous inversion scan line of the previous pixel, and the bypass signal GB may be applied as one faster inversion scan signal (the previous-previous inversion scan signal) than the previous inversion scan signal Sn−1'. In some embodiments, the bypass control line 152-1' may not be connected to the previous inversion scan line of the previous pixel, but may transmit a separate signal that is different from the previous inversion scan signal Sn−1'. When the seventh transistor T7 is turned on by a high voltage of the bypass signal GB, the initializing voltage Vint is applied to the anode of the organic light emitting diode OLED to be initialized.

A first storage electrode E1 of the storage capacitor Cst is connected to the driving voltage line 172, and the second storage electrode E2 is connected to the gate electrode G1 of the driving transistor T1, the second electrode D3 of the third transistor T3, and the second electrode D4 of the fourth transistor T4. As a result, the second storage electrode E2 determines the voltage of the gate electrode G1 of the driving transistor T1, and receives the data voltage Dm through the second electrode D3 of the third transistor T3, or receives the initializing voltage Vint through the second electrode D4 of the fourth transistor T4.

On the other hand, the anode of the organic light emitting diode OLED is connected to the second electrode D6 of the sixth transistor T6 and the first electrode S7 of the seventh transistor T7, and the cathode of the organic light emitting diode OLED is connected to the common voltage line 741 for transmitting the common voltage ELVSS.

In the exemplary embodiment of FIG. 1, the pixel circuit includes the seven transistors T1 to T7 and the one capacitor Cst, but the present invention is not limited thereto. In an example embodiment, the number of transistors, the number of capacitors and their connections may be variously changed.

Operation of one pixel of the organic light emitting diode display according to the embodiment will be described with reference to FIG. 1 and FIG. 2.

An initializing period may be mainly classified into a period in which the bypass signal GB is applied (a period during which the previous-previous inversion scan signal is applied) and a period in which the previous inversion scan signal Sn−1' is applied through the previous inversion scan line 152-1.

First, the seventh transistor T7 operates in a period in which the bypass signal GB of a high voltage is applied. In other words, when the bypass signal GB, that is, the previous-previous inversion scan signal, is applied during the initializing period, the seventh transistor T7 is turned on by the high voltage of the bypass signal GB, so that the initializing voltage Vint is applied to the anode of the organic light emitting diode OLED through the seventh transistor T7. As a result, the anode of the organic light emitting diode OLED is initialized.

Thereafter, the fourth transistor T4 is turned on during a period in which the previous inversion scan signal Sn−1' of a high voltage is applied through the previous inversion scan line 152-1, and the initializing voltage Vint is applied to the gate electrode G1 of the driving transistor T1 and the second storage electrode E2 of the storage capacitor Cst through the fourth transistor T4. Accordingly, the driving transistor T1 and the storage capacitor Cst are initialized with the initialization voltage Vint. The initializing voltage Vint has a low voltage value such that the driving transistor T1 may be turned on.

Then, during a data write period, the scan signal Sn of a low voltage and the inversion scan signal Sn' of a high voltage are supplied to the pixel PX through the scan line 151 and the main inversion scan line 151-1. The second transistor T2 is turned on by the scan signal Sn of the low voltage, and the third transistor T3 is turned on by the inversion scan signal Sn' of the high voltage.

When the second transistor T2 is turned on, the data voltage Dm is inputted to the first electrode S1 of the driving transistor T1 through the second transistor T2.

In addition, during the data writing period, the third transistor T3 is turned on, so that the second electrode D1 of the driving transistor T1 is electrically connected to the gate electrode G1 and the second storage electrode E2 of the storage capacitor Cst. In this case, the driving transistor T1 is diode-connected. Further, since the low voltage (the initializing voltage Vint) is applied to the gate electrode G1 during the initializing period, the driving transistor T1 is in a turned-on state. Accordingly, the data voltage Dm inputted to the first electrode S1 of the driving transistor T1 is outputted from the second electrode D1 through a channel of the driving transistor T1, and then is stored in the second storage electrode E2 of the storage capacitor Cst through the third transistor T3.

In this case, the voltage applied to the second storage electrode E2 is changed in accordance with the threshold voltage Vth of the drive transistor T1. That is, when the data voltage Dm is applied to the first electrode S1 of the driving transistor T1 and the initializing voltage Vint is applied to the gate electrode G1 of the driving transistor T1, a voltage outputted to the second electrode D1 may be 'Vgs+Vth'. Herein, the Vgs is a difference between voltages applied to the gate electrode G1 and the first electrode S1 of the driving transistor T1, thus it may be 'Dm−Vint'. Therefore, the voltage that is outputted from the second electrode D1 and stored in the second storage electrode E2 may be 'Dm−Vint+Vth'.

Thereafter, during a light emission period, since the light emission control signal EM supplied from the light emission control line 153 has a low voltage, the fifth transistor T5 and the sixth transistor T6 are turned on. As a result, the driving voltage ELVDD is applied to the first electrode S1 of the driving transistor T1, and the second electrode D1 of the driving transistor T1 is connected the anode to the organic light emitting diode OLED. The driving transistor T1 outputs the driving current Id according to a difference between the voltage of the gate electrode G1 and the voltage (i.e., the driving voltage ELVDD) of the first electrode S1. The driving current Id of the driving transistor T1 may have a value that is proportional to a squared value of 'Vgs−Vth'. Herein, the Vgs is a difference between voltages applied to both terminals of the storage capacitor Cst, and since the Vgs is 'Vg−Vs', it may be 'Dm−Vint+Vth−ELVDD'. Herein, when 'Vgs−Vth' is obtained by subtracting Vth, it is 'Dm−Vint−ELVDD'. That is, the driving current Id of the driving transistor T1 may be a current which is independent of a threshold voltage Vth of the driving transistor T1.

Therefore, it is possible to output an output current of the driving transistor T1 to be constant even though the driving transistors T1 disposed in respective pixels PX have different threshold voltages Vth due to process dispersion, thereby improving non-uniformity of the characteristics thereof.

In the above calculation formulas, when the transistor is a p-type transistor using a polycrystalline semiconductor, the Vth may be a value that is slightly larger than 0 or a negative value. In addition, signs of + and − may be changed depending on a direction in which the voltage is calculated. However, even in this case, the driving current Id which is an output current of the driving transistor T1 may have a value that is independent of the threshold voltage Vth.

When the above-described light emission period ends, the same operation is repeated from the initializing period.

One of the first electrode and the second electrode of each of the plurality of transistors T1, T2, T3, T4, T5, T6, and T7 may be a source electrode and the other thereof may be a drain electrode, depending on a direction in which a voltage or current is applied.

In some exemplary embodiments, in the initializing period during which the seventh transistor T7 initializes the anode of the organic light emitting diode OLED, the seventh transistor T7 may prevent even a small amount of current emitted under a condition in which the driving transistor T1 is not actually turned on from flowing toward the organic light emitting diode OLED. In this case, the small amount of current is discharged through the seventh transistor T7 to a terminal of the initializing voltage Vint as a bypass current Ibp. Accordingly, the organic light emitting diode OLED does not emit unnecessary light, so that a black gradation may be displayed more clearly and a contrast ratio may be increased.

In the pixel PX operating as described above, the driving voltage ELVDD is constantly applied to the overlapping layer 125. By applying a constant voltage, it is possible to prevent the potential of the overlapping layer 125 itself from being changed while a specific charge is injected, and it is possible to prevent a voltage of the oxide semiconductor layer of the third transistor T3 overlapping the overlapping layer 125 from being easily changed. As a result, the characteristics of the third transistor T3 are improved, and a leakage current problem of a transistor using the oxide semiconductor is solved, so that it may stably operate. When a leakage current occurs in the third transistor T3, the initializing voltage Vint is applied to the second storage electrode E2 of the storage capacitor Cst, thus the voltage stored in the storage capacitor Cst is changed. This means that the voltage of the gate electrode G1 of the driving transistor T1 is changed, and as a result, the output current outputted from the driving transistor T1 is changed, and thus a display luminance of the organic light emitting diode OLED may be changed. Therefore, since the leakage current in the third transistor T3 significantly influences the display quality, it is necessary to block the leakage current, and thus, according to the present embodiment, the leakage current is removed or reduced by the overlapping layer 125 and the stable display quality is obtained.

Hereinafter, an arrangement and connection relationship of the pixels and the overlapping layer 125 of the organic light emitting diode display according to the embodiment will be described with reference to FIG. 3 to FIG. 5.

Figure 3:
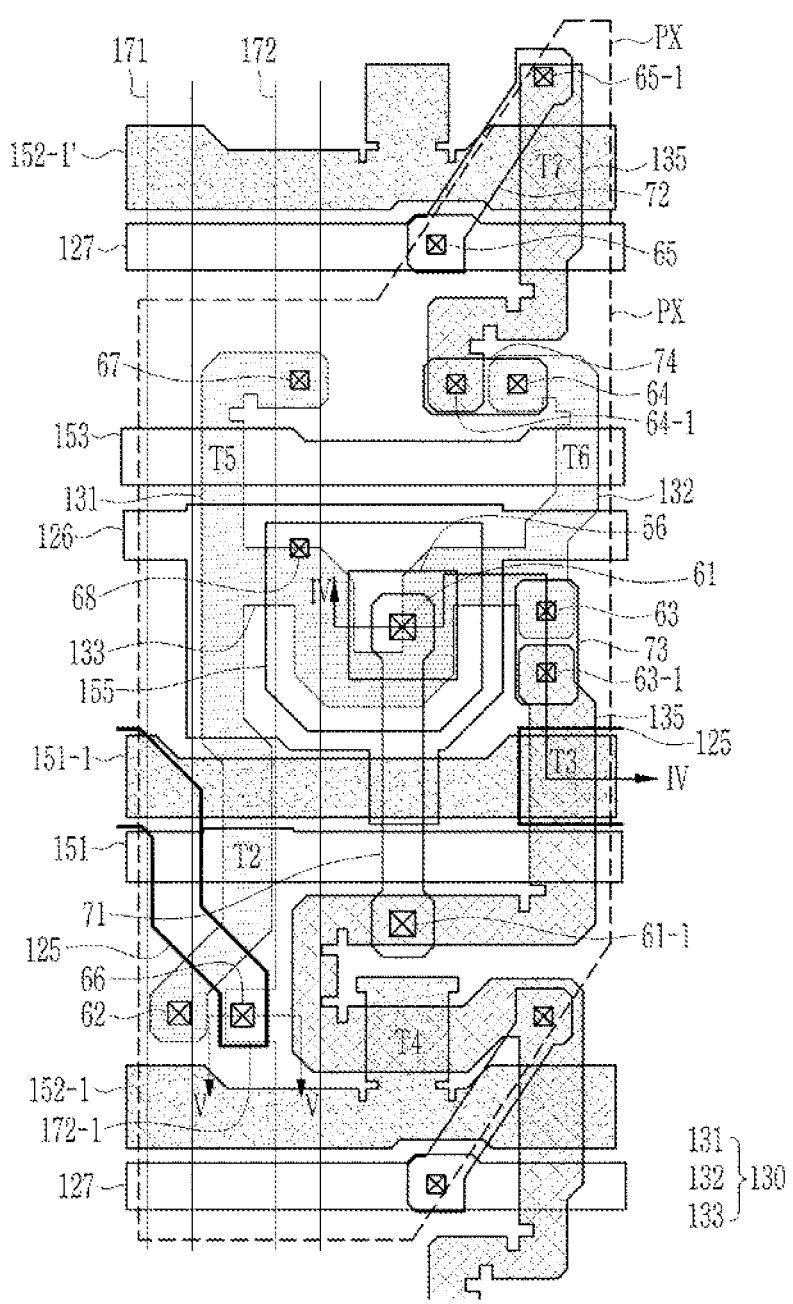
FIG. 3 illustrates a layout diagram of one pixel area of an organic light emitting diode display according to an embodiment.
Figure 4:
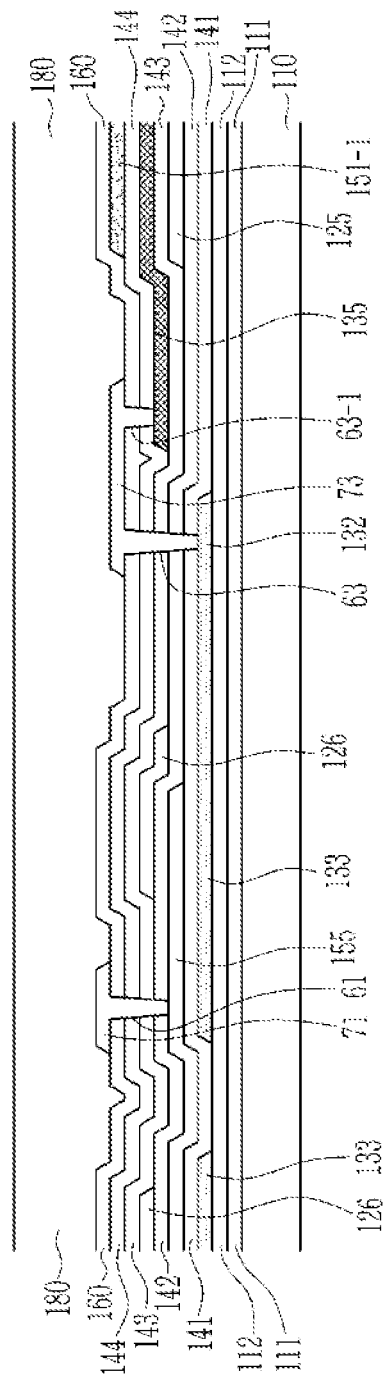
FIG. 4 illustrates a cross-sectional view taken along line IV-IV of FIG. 3.
Figure 5:
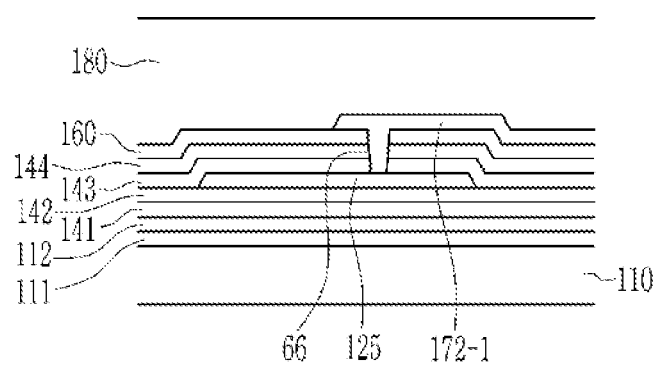
FIG. 5 illustrates a cross-sectional view taken along line V-V of FIG. 3.

FIG. 3 illustrates a layout diagram of one pixel area of an organic light emitting diode display according to an embodiment, FIG. 4 illustrates a cross-sectional view taken along line IV-IV of FIG. 3, and FIG. 5 illustrates a cross-sectional view taken along line V-V of FIG. 3.

Referring to FIG. 3 to FIG. 5, the organic light emitting diode display according to the exemplary embodiment includes the scan line 151, the main inversion scan line 151-1, the previous inversion scan line 152-1, the light emission control line 153, the bypass control line 152-1', and the initializing voltage line 127, which mainly extend in a first direction and respectively transmit the scan signal Sn, the inversion scan signal Sn', the previous inversion scan signal Sn−1', the light emission control signal EM, the bypass signal GB, and the initializing voltage Vint. The bypass signal GB may be the previous-previous inversion scan signal, and is transmitted through the previous inversion scan line of the previous pixel. The organic light emitting diode display includes the data line 171 and the driving voltage line 172 that extend in a second direction intersecting the first direction and that transmit the data voltage Dm and the driving voltage ELVDD, respectively.

In the organic light emitting diode display, one pixel PX includes the driving transistor T1, the second transistor T2, the third transistor T3, the fourth transistor T4, the fifth transistor T5, the sixth transistor T6, the seventh transistor T7, the storage capacitor Cst, and the organic light emitting diode OLED.

In addition, the organic light emitting diode display according to FIG. 3 to FIG. 5 further includes the overlapping layer 125 formed of a metal having a conductive property or a semiconductor material equivalent thereto. The overlapping layer 125 may be disposed below the semiconductor layer formed of the oxide semiconductor, may overlap the channel of the third transistor T3 in a plan view, and may at least partially overlap the first electrode and the second electrode of the third transistor T3. Referring to FIG. 5, the overlapping layer 125 is connected to the protruding portion 172-1 of the driving voltage line 172 in an adjacent pixel PX through an opening 66 to receive the driving voltage ELVDD. The overlapping layer 125 to which the driving voltage ELVDD is applied serves to cause the oxide semiconductor forming the channel of the third transistor T3 to maintain a constant voltage, and thus the third transistor T3 does not generate a leakage current such that it operates stably.

The organic light emitting diode OLED includes the anode, the organic light emitting layer, and the cathode.

The driving transistor T1, the second transistor T2, the third transistor T3, the fourth transistor T4, the fifth transistor T5, the sixth transistor T6, and the seventh transistor T7 are mainly classified into two types, which are distinguished by the materials that form respective channels. That is, they are classified into the switching transistor group formed of the oxide semiconductor and having the n-type transistor characteristic and the driving transistor group formed of the polycrystalline semiconductor and having a p-type transistor characteristic.

In the embodiment of FIG. 3, the driving transistor group includes the driving transistor T1, the second transistor T2, the fifth transistor T5, and the sixth transistor T6. The switching transistor group includes the remaining transistors, that is, the third transistor T3, the fourth transistor T4, and the seventh transistor T7.

The transistors included in respective transistor groups may be formed to include semiconductor layers having a structure connected to each other.

First, a structure of a polycrystalline semiconductor layer 130 of the driving transistor group will be described. The polycrystalline semiconductor layer 130 includes a first polycrystalline semiconductor layer 131, a second polycrystalline semiconductor layer 132, and a third polycrystalline semiconductor layer 133 connecting the first polycrystalline semiconductor layer 131 and the second polycrystalline semiconductor layer 132.

The first polycrystalline semiconductor layer 131 has a structure mainly extending in the first direction at a left side of FIG. 3, and channels of the second transistor T2 and the fifth transistor T5 are formed therein. Portions of the first polycrystalline semiconductor layer 131, other than the channel of the second transistor T2 and the channel of the fifth transistor T5, may be doped to have the same characteristics as a wire.

The second polycrystalline semiconductor layer 132 has a structure mainly extending in the first direction at a right side of FIG. 3, and a channel of the sixth transistor T6 is formed therein. A portion of the second polycrystalline semiconductor layer 132 other than the channel of the sixth transistor T6 may be doped to have the same characteristics as a wire.

The third polycrystalline semiconductor layer 133 connects the first polycrystalline semiconductor layer 131 and the second polycrystalline semiconductor layer 132, and has a U-shaped structure. The third polycrystalline semiconductor layer 133 includes a channel of the driving transistor T1, and a portion other than the channel of the driving transistor T1 doped to have the same characteristics as a wire.

In addition, the polycrystalline semiconductor layer 130 involves at least one of first electrode and second electrode of the driving transistor T1, the second transistor T2, the fifth transistor T5, and the sixth transistor T6. The first electrode and the second electrode are disposed in the doped region and electrically connect transistors adjacent thereto.

Each of the channels of the driving transistor T1, the second transistor T2, the fifth transistor T5, and the sixth transistor T6 included in the driving transistor group overlaps a corresponding gate electrode, and is disposed between the first electrode and the second electrode. The driving transistor T1, the second transistor T2, the fifth transistor T5, and the sixth transistor T6 included in the driving transistor group have substantially the same stacked structure. Hereinafter, structures of the driving transistor T1, the second transistor T2, the fifth transistor T5, and the sixth transistor T6 included in the driving transistor group will be described.

The driving transistor T1 includes a channel, a gate electrode 155, a first electrode S1, and a second electrode D1. The channel of the driving transistor T1 is between the first electrode S1 and the second electrode D1, and overlaps the gate electrode 155 in a plan view. The channel is formed in the third polycrystalline semiconductor layer 133, and is bent in a U-shape to form a long channel in a limited region. A driving voltage range of the gate voltage Vg applied to the gate electrode 155 of the driving transistor T1 may increase as a length of the channel increases, and the driving current Id steadily increases in accordance with the gate voltage Vg. Accordingly, a gray of light emitted from the organic light emitting diode OLED may be finely controlled by changing the gate voltage Vg, and the display quality of the organic light emitting diode display may also be improved. In addition, since the channel extends in several directions rather than extending in one direction, effects due to directionality are offset in a manufacturing process, thereby reducing an effect of process variation. Therefore, it is possible to avoid degradation in image quality such as spot defects (for example, a luminance difference occurring depending on pixels even if the same data voltage Dm is applied). The spot defects may occur due to the change in the characteristic of the driving transistor T1 according to the region of the display device due to the process dispersion. A shape of the channel is not limited to the shown U-shape, but may be various shapes such as an Ω shape, an S shape, and the like.

The gate electrode 155 overlaps the channel in a plan view. The first and second electrodes S1 and S2 are disposed at opposite sides of the channel. An extended portion of a storage line 126 is isolated from and disposed on the gate electrode 155. The extended portion of the storage line 126 overlaps the gate electrode 155 with a second gate insulating film therebetween in a plan view to form the storage capacitor Cst. The extended portion of the storage line 126 is a first storage electrode (E1 of FIG. 1) of the storage capacitor Cst, and the gate electrode 155 is a second storage electrode (E2 of FIG. 1). The extended portion of the storage line 126 is provided with an opening 56 so that the gate electrode 155 may be connected to a first data connecting member 71. An upper surface of the gate electrode 155 and the first data connecting member 71 are electrically connected through an opening 61 in the opening 56. The first data connecting member 71 is connected to the second electrode D3 of the third transistor T3 to connect the gate electrode 155 of the driving transistor T1 to the second electrode D3 of the third transistor T3.

The gate electrode of the second transistor T2 may be a portion of the scan line 151. The data line 171 is connected to the first electrode S2 of the second transistor T2 through an opening 62, and the first electrode S2 and the second electrode D2 may be disposed on the first polycrystalline semiconductor layer 131.

The gate electrode of the fifth transistor T5 may be a part of the light emission control line 153. The driving voltage line 172 is connected to the first electrode S5 of the fifth transistor T5 through an opening 67, and the second electrode D5 is connected to the first electrode S1 of the driving transistor T1 through the first polycrystalline semiconductor layer 131.

The gate electrode of the sixth transistor T6 may be a part of the light emission control line 153. The second electrode D6 of the sixth transistor T6 is connected to the first electrode S7 of the seventh transistor T7 using an opening 64 exposing the 132, an opening 64-1 exposing the oxide semiconductor layer 135 and a fourth data connecting member 74, and is also connected to the anode of the organic light emitting diode OLED. In addition, the first electrode S6 is connected to the second electrode D1 of the driving transistor T1 through the second polycrystalline semiconductor layer 132.

On the other hand, the oxide semiconductor layer 135 of the switching transistor group is formed on a different layer from that of the polycrystalline semiconductor layer 130, and has a long extended structure. The oxide semiconductor layer 135 is disposed on a higher layer than the gate electrode 155 and the storage line 126. The oxide semiconductor layer 135 includes a channel of the third transistor T3, a channel of the fourth transistor T4, and a channel of the seventh transistor T7. In addition, a portion of the oxide semiconductor layer 135 in which the channel of the third transistor T3, the channel of the fourth transistor T4, and the channel of the seventh transistor T7 are excluded, is doped to have the same characteristics as a wire. In this case, the channel of the seventh transistor T7 is included in a lower pixel PX, and the seventh transistor T7 disposed in the oxide semiconductor layer 135 is included in this pixel PX.

In addition, at least some of the channel of the third transistor T3, the channel of the fourth transistor T4, and the first electrode and the second electrode of the seventh transistor T7 are formed in the oxide semiconductor layer 135. The first electrode and the second electrode are disposed in the doped region, and electrically connect transistors adjacent thereto.

Each of the channels of the third transistor T3, the fourth transistor T4, and the seventh transistor T7 included in the switching transistor group overlaps each gate electrode, and is disposed between the first electrode and the second electrode. The stacked structures around the channels of third transistor T3, the fourth transistor T4, and the seventh transistor T7 included in the switching transistor group are substantially the same. Hereinafter, a structure of the channel of the third transistor T3, the channel of the fourth transistor T4, and the channel of the seventh transistor T7 included in the switching transistor group will be described.

The channel of the third transistor T3 is formed at a portion where the main inversion scan line 151-1 and the oxide semiconductor layer 135 meet. The gate electrode G3 of the third transistor T3 may be a part of the main inversion scan line 151-1. The first electrode S3 of the third transistor T3 is connected to the second polycrystalline semiconductor layer 132 through a third data connecting member 73, thus it is connected to the first electrode S6 of the sixth transistor T6 and the second electrode D1 of the driving transistor T1. The second electrode D3 of the third transistor T3 is connected to the first data connecting member 71 through an opening 61-1.

The overlapping layer 125 is formed under the channel of the third transistor T3. The overlapping layer 125 may overlap the channel of the third transistor T3 in a plan view, and may partially overlap at least some of the first and second electrodes S3 and D3 of the third transistor T3, and in some embodiments, the overlapping layer 125 may overlap the entire of the first and second electrodes S3 and D3 of the third transistor T3.

The overlapping layer 125 includes a portion overlapping the channel of the third transistor T3 and a connecting portion connected thereto. Referring to FIG. 3, the connecting portion of the overlapping layer 125 extends from the portion overlapping the channel of the third transistor T3 toward the right pixel PX, and is connected to the driving voltage line 172 through the opening 66 in the right pixel PX to receive the driving voltage ELVDD. The overlapping layer 125 is formed in a second gate conductor. Hereinafter, the second gate conductor may also be referred to as a second conductor.

The connecting portion of the overlapping layer 125 is connected to the driving voltage line 172 through the opening 66 in the right pixel PX to receive the driving voltage ELVDD. The driving voltage line 172 has an extension, and the extension is electrically connected to the overlapping layer 125 through the opening 66 to transmit the driving voltage ELVDD to the overlapping layer 125. The opening 66 is formed over a third gate insulating film 143, a fourth gate insulating film 144, and an interlayer insulating film 160. Hereinafter, the third gate insulating film 143, the fourth gate insulating film 144, and the interlayer insulating film 160 may also be referred to as a third insulating film, a fourth insulating film, and a fifth insulating film, respectively.

Although a structure including two transistors for eliminating a leakage current from the third transistor T3 (a structure in which the same signal is applied to the gate electrodes of the two transistors and the one inputted to the one transistor is outputted to the other transistor) may be provided, in the present embodiment, since the leakage current is reduced by the overlapping layer 125, a structure not including two transistors may be provided. As a high-resolution pixel is developed, a problem in which a space for forming an actual pixel is reduced occurs, but this structure has an advantage that a pixel may be formed even in a small area.

The channel of the fourth transistor T4 is formed at a portion where the previous inversion scan line 152-1 and the oxide semiconductor layer 135 meet. The gate electrode G4 of the fourth transistor T4 may be a part of the previous inversion scan line 152-1. A second data connecting member 72 is connected to the first electrode S4 of the fourth transistor T4 through an opening 65-1 to receive the initializing voltage Vint, and the first data connecting member 71 is connected to the second electrode D2 of the fourth transistor T4 through the opening 61-1.

The channel of the seventh transistor T7 is formed at a portion where the bypass control line 152-1' and the oxide semiconductor layer 135 meet. The gate electrode of the seventh transistor T7 may be a part of the bypass control line 152-1', and the bypass control line 152-1' may be electrically connected to the previous inversion scan line 152-1' of the previous pixel. The first electrode S7 of the seventh transistor T7 is connected to the fourth data connecting member 74 through an opening 64-1, and electrically connected to the anode of the organic light emitting diode OLED. In addition, the second electrode D7 is connected to the second data connecting member 72 through the opening 65-1, and the initializing voltage Vint is applied thereto.

The storage capacitor Cst includes the first storage electrode E1 and the second storage electrode E2 which overlap each other with a second gate insulating film 142 therebetween. Hereinafter, the second gate insulating film 142 may be referred to as a second insulating film. The second storage electrode E2 corresponds to the gate electrode 155 of the driving transistor T1, and the first storage electrode E1 may be the extended portion of the storage line 126. Herein, the second gate insulating film 142 becomes a dielectric, and a capacitance is determined by a charge stored in the storage capacitor Cst and a voltage between the first and second storage electrodes E1 and E2. By using the gate electrode 155 as the second storage electrode E2, a space capable of forming the storage capacitor Cst in a space that is narrowed by the channel of the driving transistor T1 occupying a large area in the pixel may be secured.

The driving voltage line 172 is connected to the first storage electrode E1 through a contact opening 68. Accordingly, the storage capacitor Cst stores a charge corresponding to a difference between the driving voltage ELVDD transmitted to the first storage electrode E1 through the driving voltage line 172 and the gate voltage Vg of the gate electrode 155.

The first data connecting member 71 includes one end connected to the gate electrode 155 through the opening 56 formed in the storage line 126, and the other end connected to the second electrode D3 of the third transistor T3 disposed in the oxide semiconductor layer 135. The first data connecting member 71 is connected to the gate electrode 155 through the opening 61, and is connected to the oxide semiconductor layer 135 through the opening 61-1.

The second data connecting member 72 includes one end connected to the initializing voltage line 127 through an opening 65 and the other end connected to the second electrode D7 of the seventh transistor T7 disposed in the oxide semiconductor layer 135 and to the first electrode S4 of the fourth transistor T4 through the opening 65-1.

The oxide semiconductor layer 135 and the second polycrystalline semiconductor layer 132 are electrically connected to each other through the third data connecting member 73 and the fourth data connecting member 74.

The third data connecting member 73 is connected to the second polycrystalline semiconductor layer 132 through an opening 63, and is connected to the oxide semiconductor layer 135 through an opening 63-1. As a result, the second electrode D1 of the driving transistor T1 and the first electrode S3 of the third transistor T3 are electrically connected.

The fourth data connecting member 74 is connected to the second polycrystalline semiconductor layer 132 through the opening 64, and is connected to the oxide semiconductor layer 135 through the opening 64-1. As a result, the second electrode D6 of the sixth transistor T6 and the first electrode S7 of the seventh transistor T7 are electrically connected, and although not shown, they are electrically connected to the anode of the organic light emitting diode OLED. They may be connected through an additional connecting member (not shown) when electrically connected to the anode of the organic light emitting diode OLED.

Hereinafter, a sectional structure of the organic light emitting diode display according to the embodiment will be described according to a stacked order with reference to FIG. 4 and FIG. 5.

The organic light emitting diode display according to the embodiment includes a rigid substrate such as glass, or a substrate formed of a flexible material such as plastic or polyimide (PI).

A barrier layer 111 is disposed on the substrate 110, and a buffer layer 112 is disposed on the barrier layer 111. The barrier layer 111 and the buffer layer 112 may include an inorganic insulating material such as a silicon oxide, a silicon nitride, or an aluminum oxide, and may also include an organic insulating material such as a polyimide acrylic (epoxy added).

A semiconductor layer for a transistor included in the driving transistor group is formed on the buffer layer 112. That is, the polycrystalline semiconductor layer 130 is disposed thereon, and the polycrystalline semiconductor layer 130 includes the channels of the driving transistor T1, the second transistor T2, the fifth transistor T5, and the sixth transistor T6, and the first electrodes or the second electrodes of these transistors.

A first gate insulating film 141 covering the polycrystalline semiconductor layer 130 is disposed on the polycrystalline semiconductor layer 130 including the second polycrystalline semiconductor layer 132 and the third polycrystalline semiconductor layer 133. Hereinafter, the first gate insulating film 141 may also be referred to as a first insulating film.

A first gate conductor including the gate electrodes of the transistors included in the driving transistor group, the scan line 151, and the light emission control line 153 is disposed on the first gate insulating film 141. Hereinafter, the first gate conductor may also be referred to as a first conductor. The gate electrodes of the transistors included in the driving transistor group overlap the channels of the transistors included in each driving transistor group. The scan line 151 and the light emission control line 153 extend in the first direction.

The first gate conductor will be more specifically described below.

The scan line 151 extends in the first direction, and a portion thereof overlapping the first polycrystalline semiconductor layer 131 operates as the gate electrode of the second transistor T2.

The light emission control line 153 also extends in the first direction, a portion thereof overlapping the first polycrystalline semiconductor layer 131 operates as the gate electrode of the fifth transistor T5, and a portion thereof overlapping the second polycrystalline semiconductor layer 132 operates as the gate electrode of the sixth transistor T6.

On the other hand, the gate electrode 155 of the driving transistor T1 is also formed of the first gate conductor, and has an island structure.

The second gate insulating film 142 covering the first gate conductor and the exposed first gate insulating film 141 is disposed on them.

The second gate conductor including the storage line 126, the initializing voltage line 127, and the overlapping layer 125 is disposed on the second gate insulating film 142.

The second gate conductor will be more specifically described below.

The storage line 126 extends in the first direction, and has an extension. The extension of the storage line 126 serves as the first storage electrode E1, and has the opening 56 exposing a portion of the gate electrode 155 formed of the first gate conductor.

The initializing voltage line 127 also extends in the first direction, and transmits the initializing voltage Vint, which is constant.

The overlapping layer 125 is disposed at a portion where the channel of the third transistor T3 is to be formed, and has an island structure. In addition, the overlapping layer 125 according to the present embodiment has a structure that extends to the pixel PX disposed at the right side, and receives the driving voltage ELVDD from the pixel PX disposed at the right side.

The third gate insulating film 143 covering the second gate conductor and the exposed second gate insulating film 142 is disposed on them.

The oxide semiconductor layer 135 for a transistor included in the switching transistor group is formed on the third gate insulating film 143. The oxide semiconductor layer 135 includes the channel of the third transistor T3, the channel of the fourth transistor T4, and the channel of the seventh transistor T7, and may include the first electrode or the second electrode of these transistors.

Figure 11:
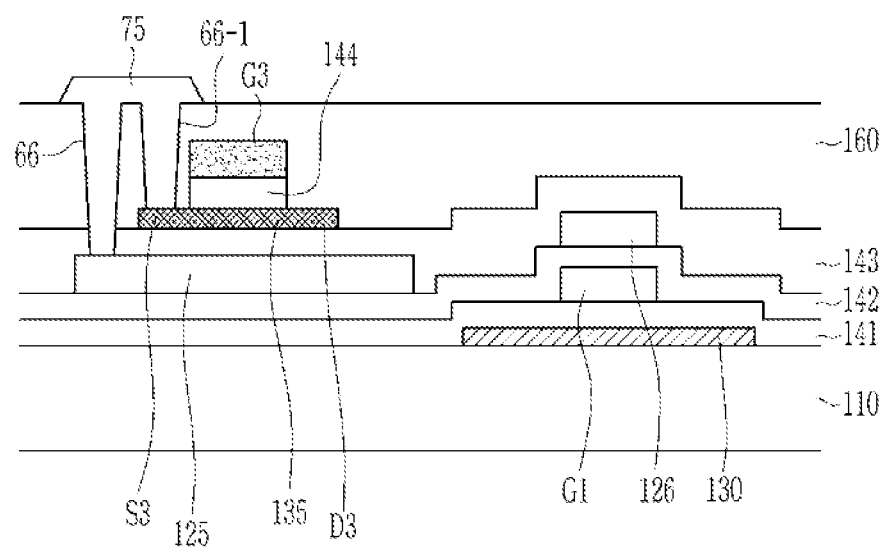
FIG. 11 and FIG. 12 illustrate cross-sectional views of a portion of one pixel in an organic light emitting diode display according to an embodiment.
Figure 12:
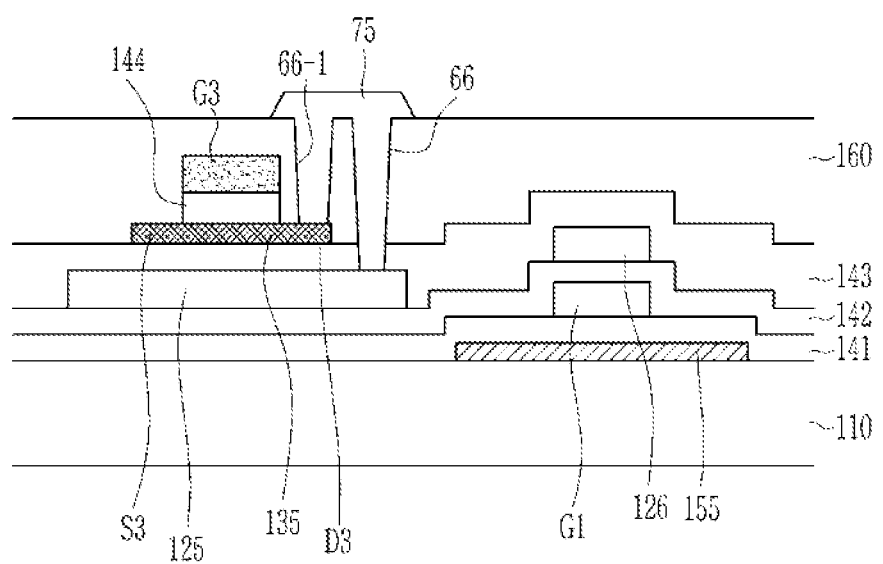

The fourth gate insulating film 144 covering the oxide semiconductor layer 135 and the exposed third gate insulating film 143 is disposed on them. Referring to FIG. 4 and FIG. 5, although the fourth gate insulating film 144 is formed over the entire region, as shown in FIG. 11 and FIG. 12, the fourth gate insulating film 144 is etched together with a third gate conductor existing thereon such that the third gate conductor and the fourth gate insulating film 144 may be formed to have the same planar structure. Hereinafter, the third gate conductor may also be referred to a third conductor.

The first gate insulating film 141, the second gate insulating film 142, the third gate insulating film 143, and the fourth gate insulating film 144 may be formed of an inorganic insulating material such as a silicon nitride, a silicon oxide, and a silicon oxynitride (SiON).

The third gate conductor including the gate electrodes of the transistors included in the switching transistor group, the main inversion scan line 151-1, the previous inversion scan line 152-1, and the bypass control line 152-1' is disposed on the fourth gate insulating film 144.

The third gate conductor will be more specifically described below.

The main inversion scan line 151-1 extends in the first direction, and a portion thereof overlapping the oxide semiconductor layer 135 operates as the gate electrode of the third transistor T3.

The previous inversion scan line 152-1 also extends in the first direction, and a portion thereof overlapping the oxide semiconductor layer 135, which is a portion protruding upward, operates as the gate electrode of the fourth transistor T4.

The bypass control line 152-1' also extends in the first direction, and a portion thereof overlapping the oxide semiconductor layer 135 operates as the gate electrode of the seventh transistor T7. Particularly, in the present embodiment, the bypass control line 152-1' is the same line as the previous inversion scan line 152-1 connected to the gate electrode of the fourth transistor T4 in the previous pixel PX.

The interlayer insulating film 160 covering the third gate conductor is disposed on the third gate conductor. The interlayer insulating film 160 may be formed of an inorganic insulating material such as a silicon nitride, a silicon oxide, and a silicon oxynitride (SiON).

The interlayer insulating film 160, the fourth gate insulating film 144, the third gate insulating film 143, the second gate insulating film 142, and the first gate insulating film 141 may be provided with an opening so that the data conductor formed on the interlayer insulating film 160 may be connected to another conductor or a semiconductor layer. Hereinafter, the data conductor may also be referred to as a fourth conductor. In this case, a depth of the opening may be very deep. When the opening is formed, the opening with a certain depth and the opening with a deeper depth may be formed by different processes, thereby reducing an etching burden applied to each layer.

The data conductor including the data line 171, the driving voltage line 172, the first data connecting member 71, the second data connecting member 72, the third data connecting member 73, and the fourth data connecting member 74 is disposed on the interlayer insulating film 160.

The data conductor will be more specifically described below.

The data line 171 extends in the second direction, and is electrically connected to the first polycrystalline semiconductor layer 131 through the opening 62 at a portion overlapping the first polycrystalline semiconductor layer 131 to transmit the data voltage to the first electrode S2 of the second transistor T2. Here, the opening 62 is formed over the first gate insulating film 141, the second gate insulating film 142, the third gate insulating film 143, the fourth gate insulating film 144, and the interlayer insulating film 160.

The driving voltage line 172 also extends in the second direction, and transmits the driving voltage ELVDD. The driving voltage line 172 is connected to the first electrode S5 of the fifth transistor T5 through the opening 67 formed over the first gate insulating film 141, the second gate insulating film 142, the third gate insulating film 143, and the fourth gate insulating film 144, and is connected to the extension (the first storage electrode E1) of the storage line 126 through the contact opening 68 formed in the third gate insulating film 143, the fourth gate insulating film 144, and the interlayer insulating film 160. In addition, the driving voltage line 172 has an extension, and the extension is electrically connected to the overlapping layer 125 through the opening 66 to transmit the driving voltage ELVDD to the overlapping layer 125. The opening 66 is formed over the third gate insulating film 143, the fourth gate insulating film 144, and the interlayer insulating film 160.

One end of the first data connecting member 71 is connected to the gate electrode 155 through the opening 61 formed in the second gate insulating film 142, the third gate insulating film 143, the fourth gate insulating film 144, and the interlayer insulating film 160, and the other end thereof is connected to the second electrode D3 of the third transistor T3 and the second electrode D4 of the fourth transistor T4 through the opening 61-1 formed in the fourth gate insulating film 144 and the interlayer insulating film 160.

One end of the second data connecting member 72 is connected to the first electrode S4 of the fourth transistor T4 and the second electrode D7 of the seventh transistor T7 through the opening 65-1 formed in the fourth gate insulating film 144 and the interlayer insulating film 160, and the other end thereof is connected to the initializing voltage line 127 through the opening 65 formed in the third gate insulating film 143, the fourth gate insulating film 144, and the interlayer insulating film 160.

In addition, the data conductor further includes the third data connecting member 73 and the fourth data connecting member 74, which connect the polycrystalline semiconductor layer 130 and the oxide semiconductor layer 135.

The third data connecting member 73 is connected to the second polycrystalline semiconductor layer 132 through the opening 63, and is connected to the oxide semiconductor layer 135 through the opening 63-1.

The fourth data connecting member 74 is connected to the second polycrystalline semiconductor layer 132 through the opening 64, and is connected to the oxide semiconductor layer 135 through the opening 64-1.

Here, the openings 63 and 64 are formed over the first gate insulating film 141, the second gate insulating film 142, the third gate insulating film 143, the fourth gate insulating film 144, and the interlayer insulating film 160, and the openings 63-1 and 64-1 are formed over the fourth gate insulating film 144 and the interlayer insulating film 160.

When the data conductor is electrically connected to the polycrystalline semiconductor layer, the first gate conductor, the second gate conductor, or the third gate conductor disposed thereunder, the electrical connection therebetween may be difficult due to a difference of depths between the layers, and thus an auxiliary gate electrode as a layer (the first gate conductor, the second gate conductor, or the third gate conductor) disposed therebetween, may be further formed.

A passivation 180 covering the data conductor is disposed on the data conductor. The passivation 180, also referred to as a planarization film, may include an organic insulating material. An anode (not shown) that is one electrode of the organic light emitting diode (OLED), is disposed on the passivation 180. The anode is electrically connected to the sixth transistor T6 and the seventh transistor T7 through an opening (not shown) formed in the passivation 180. A partition wall (not shown) is disposed on the passivation 180 and the anode. The partition wall has an open portion overlapping the anode, and an organic light emitting layer (not shown) is disposed in the open portion. A cathode (not shown) that is another electrode of the organic light emitting diode OLED is disposed on the organic light emitting layer and the partition wall. The anode, the organic light emitting layer, and the cathode form the organic light emitting diode OLED. In some embodiments, positions of the anode and the cathode may be changed. When holes and electrons are injected into the light emitting layer from the anode and the cathode, respectively, light is emitted when excitons in which the injected holes and electrons are combined enter a ground state from an excited state.

Although not shown, an encapsulation layer (not shown) for protecting the organic light emitting diode (OLED) is disposed on the common electrode. The encapsulation layer may be in contact with the common electrode, or may be spaced apart from the common electrode. The encapsulation layer may be a thin film encapsulation layer in which an inorganic film and an organic film are stacked, and may include a triple layer formed of an inorganic film, an organic film, and an inorganic film. A capping layer and a functional layer may be disposed between the common electrode and the encapsulation layer.

A sectional position of the overlapping layer 125 in the present embodiment and a structure in which the overlapping layer 125 are electrically connected to the driving voltage line 172 are specifically shown in the specific cross-sectional views of FIG. 4 and FIG. 5.

FIG. 4 specifically illustrates the sectional position of the overlapping layer 125.

The barrier layer 111, the buffer layer 112, a first gate insulating film 141, and the second gate insulating film 142 are sequentially disposed on the substrate 110, and the overlapping layer 125 is disposed thereon. The third gate insulating film 143 is disposed on the overlapping layer 125, and the oxide semiconductor layer 135 is disposed thereon. The fourth gate insulating film 144 is disposed on the oxide semiconductor layer 135. The gate electrode of the third transistor T3 is formed on the fourth gate insulating film 144, and the gate electrode of the third transistor T3 is disposed on the main inversion scan line 151-1. The interlayer insulating film 160 is disposed on the gate electrode of the third transistor T3, and the passivation 180 is disposed thereon.

Referring to FIG. 5, the connection structure of the overlapping layer 125 and the driving voltage line 172 can be clearly seen.

The barrier layer 111, the buffer layer 112, the first gate insulating film 141, and the second gate insulating film 142 are sequentially disposed on the substrate 110, and the overlapping layer 125 is disposed thereon. The third gate insulating film 143 is disposed on the overlapping layer 125, the fourth gate insulating film 144 is disposed thereon, and the interlayer insulating film 160 is disposed thereon. The extension of the driving voltage line 172 is disposed on the interlayer insulating film 160, and the extension of the driving voltage line 172 is electrically connected to the overlapping layer 125 through the opening 66. The opening 66 is formed over the third gate insulating film 143, the fourth gate insulating film 144, and the interlayer insulating film 160.

The overlapping layer 125 according to the above-described embodiment has a structure in which the driving voltage ELVDD is applied thereto and it overlaps the channel of the third transistor T3 in a plan view. In addition, since the driving voltage ELVDD, which is a positive voltage, is applied thereto so that the voltage of the oxide semiconductor layer 135 disposed in the lower portion is maintained, the leakage current occurring from the oxide semiconductor is reduced, and it serves to stably operate the organic light emitting diode display.

Above, it is exemplary described that in the pixel for the organic light emitting diode display including the transistors of the driving transistor group in which the semiconductor layer is formed of the polycrystalline semiconductor and the transistors of the switching transistor group in which the oxide semiconductor layer is formed, the third transistor T3 which is one of the transistors of the switching transistor group is provided with the overlapping layer 125 overlapping the channel of the third transistor T3 and the overlapping layer 125 is applied with the driving voltage ELVDD.

Hereinafter, another embodiment will be described with reference to FIG. 6 to FIG. 8.

Figure 6:
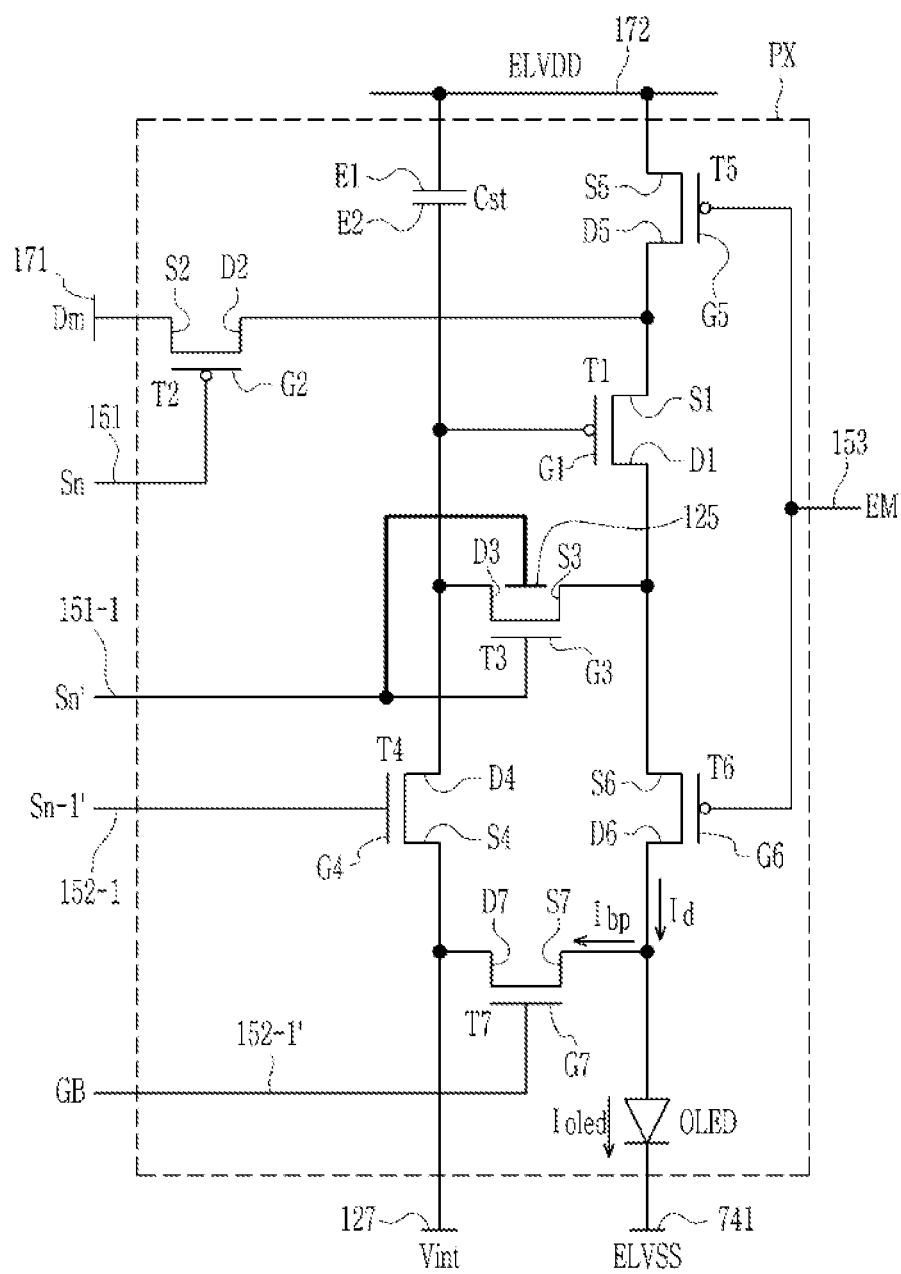
FIG. 6 illustrates an equivalent circuit diagram of one pixel of an organic light emitting diode display according to an embodiment.
Figure 7:
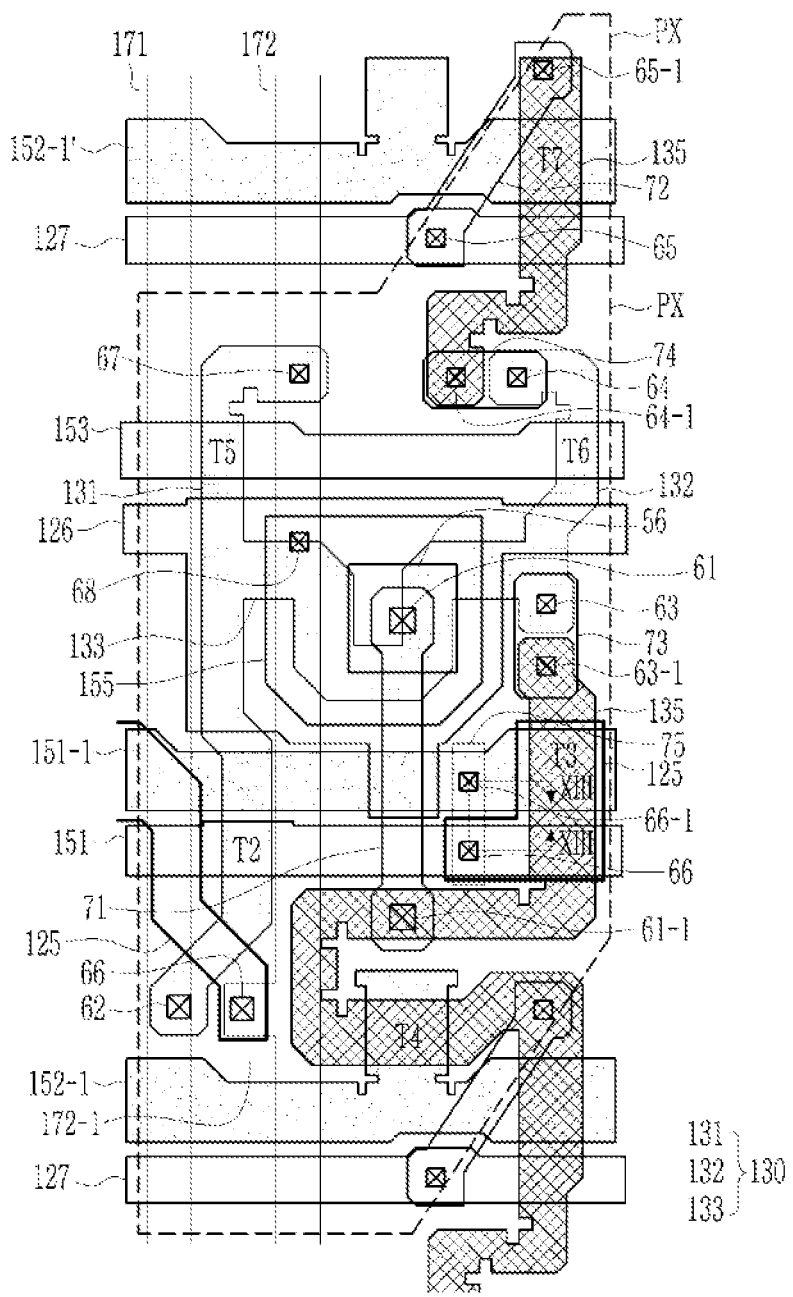
FIG. 7 illustrates a layout diagram of one pixel area of an organic light emitting diode display according to an embodiment.
Figure 8:
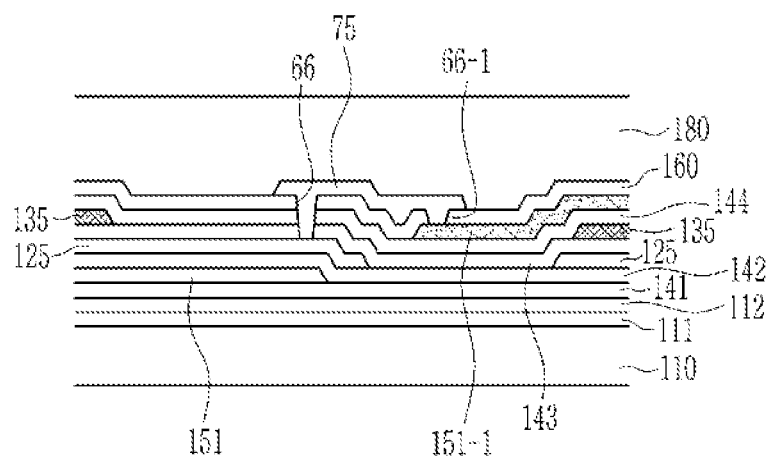
FIG. 8 illustrates a cross-sectional view taken along line VIII-VIII of FIG. 7.

In the embodiment of FIG. 6 to FIG. 8, the voltage applied to the overlapping layer 125 is connected to the gate electrode G3 which is one of three electrodes of the third transistor T3.

Hereinafter, different features from the embodiment of FIG. 1 to FIG. 5 will be mainly described.

First, a circuit configuration will be described with reference to FIG. 6.

FIG. 6 illustrates an equivalent circuit diagram of one pixel of an organic light emitting diode display according to an embodiment.

FIG. 6 differs from FIG. 1 in that the overall circuit configuration of the pixel PX is substantially similar, but the overlapping layer 125 is connected to the gate electrode G3 of the third transistor T3. That is, instead of the driving voltage ELVDD, the inversion scan signal Sn' applied to the main inversion scan line 151-1 connected to the gate electrode G3 of the third transistor T3 is applied to the overlapping layer 125 disposed below the oxide semiconductor layer 135 of the third transistor T3. Since the gate electrode G3 of the third transistor T3 is disposed on an upper side of the oxide semiconductor layer 135 and the same signal is applied to the gate electrode G3 and the overlapping layer 125 disposed on upper and lower sides of the oxide semiconductor layer 135, it performs the same operation as in a structure in which two gate electrodes (bottom gate and top gate) exist. A transistor having such a double gate structure may have a lower voltage difference (Vgs) between the gate electrode and the source electrode than that having a structure using a single gate electrode, resulting in more stable characteristics and a reduced leakage current.

Hereinafter, a structure in which a pixel PX having the characteristics of the circuit of FIG. 6 is actually implemented will be described with reference to FIG. 7 and FIG. 8.

FIG. 7 illustrates a layout diagram of one pixel area of an organic light emitting diode display according to an embodiment, and FIG. 8 illustrates a cross-sectional view taken along line VIII-VIII of FIG. 7.

The embodiment of FIG. 7 and FIG. 8 differs from that of FIG. 3 to FIG. 5 in a structure of the overlapping layer 125 and a portion connected to the overlapping layer 125.

The overlapping layer 125 includes a portion overlapping the channel of the third transistor T3 and a connecting portion connected thereto. Referring to FIG. 7, the portion of the overlapping layer 125 overlapping the channel of the third transistor T3 and the connecting portion of the overlapping layer 125 connected thereto have a structure bent at 90 degrees from each other. The overlapping layer 125 is formed in the second gate conductor.

The overlapping layer 125 and the gate electrode of the third transistor T3 are connected to each other to receive the inversion scan signal Sn'. The main inversion scan line 151-1 and the overlapping layer 125 are connected to each other using a connecting auxiliary portion 75. Here, the connecting auxiliary portion 75 is formed in the data conductor. That is, one end of the connecting auxiliary portion 75 is connected to the overlapping layer 125 through the opening 66, and the other end is connected to the main inversion scan line 151-1 through the opening 66-1. Here, the opening 66 is formed through the third gate insulating film 143, the fourth gate insulating film 144, and the interlayer insulating film 160, and the opening 66-1 is formed through the interlayer insulating film 160.

The structure in which the overlapping layer 125 operates as the additional gate electrode of the third transistor T3 has been described above.

Hereinafter, an embodiment in which a separate voltage from the outside is applied to the overlapping layer 125 will be described with reference to FIG. 9 and FIG. 10.

Hereinafter, different features from the embodiment of FIG. 1 to FIG. 5 will be mainly described, and first, a circuit configuration will be described with reference to FIG. 9.

Figure 9:
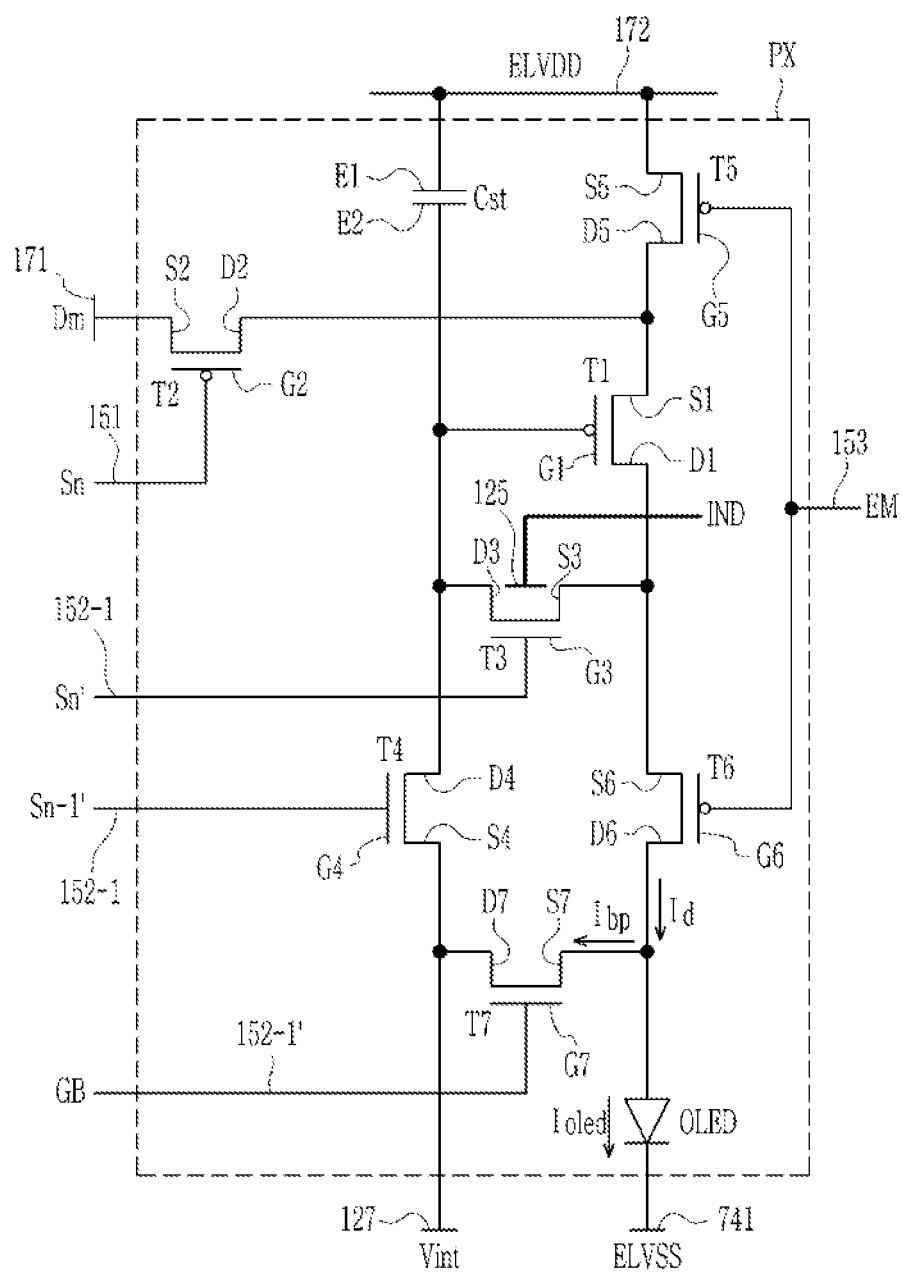
FIG. 9 illustrates an equivalent circuit diagram of one pixel of an organic light emitting diode display according to an embodiment.

FIG. 9 illustrates an equivalent circuit diagram of one pixel of an organic light emitting diode display according to an embodiment.

FIG. 9 differs from FIG. 1 in that the overall circuit configuration of the pixel PX is substantially similar, but the overlapping layer 125 receives a separate input signal IND. That is, instead of the driving voltage ELVDD, the separate input signal IND applied from the outside is applied to the overlapping layer 125 disposed below the oxide semiconductor layer 135 of the third transistor T3, and the input signal IND of the present embodiment has a constant positive voltage. The separate input signal IND, disposed below the oxide semiconductor layer 135 of the third transistor T3, serves to maintain the voltage of the oxide semiconductor layer 135 so that the leakage current of the third transistor T3 is removed and the third transistor is stabilized.

Hereinafter, a structure in which the pixel PX having the characteristics of the circuit of FIG. 9 is actually implemented will be described with reference to FIG. 10.

Figure 10:
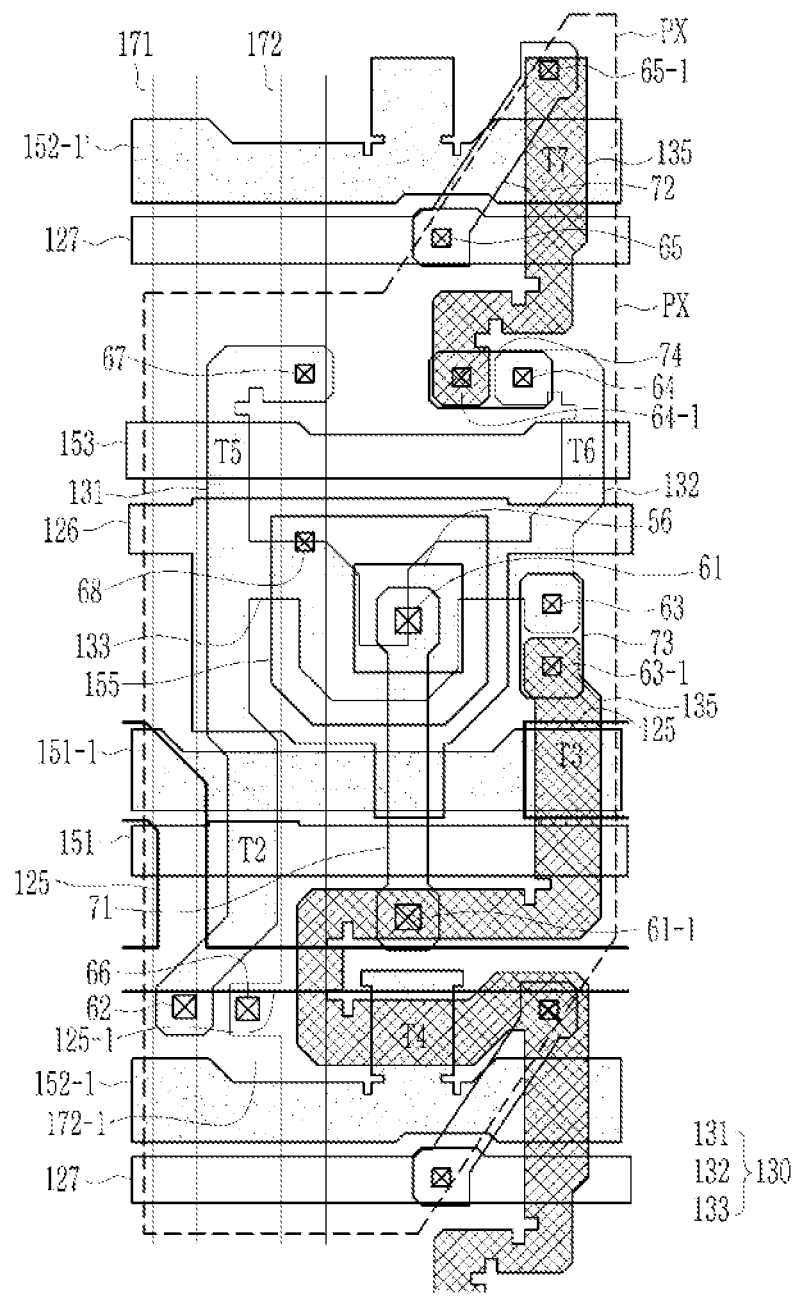
FIG. 10 illustrates a layout diagram of one pixel area of an organic light emitting diode display according to an embodiment.

FIG. 10 illustrates a layout diagram of one pixel area of an organic light emitting diode display according to an embodiment.

The embodiment of FIG. 10 differs from that of FIG. 3 to FIG. 5 in a structure of the overlapping layer 125 and a portion connected to the overlapping layer 125.

The overlapping layer 125 includes a portion overlapping the channel of the third transistor T3 and a connecting portion connected thereto. In addition, the embodiment of FIG. 10 further includes a voltage application line 125-1 connected to the overlapping layer 125 formed in adjacent left and right pixels. The voltage application line 125-1 for the overlapping layer extends along the first direction, and the voltage application line 125-1 for the overlapping layer and the overlapping layer 125 are formed in the second gate conductor. The voltage application line 125-1 for the overlapping layer may extend to a non-display area outside the display area, and may receive a positive voltage in the non-display area.

Unlike the other embodiments, the structure of the overlapping layer 125 shown in FIG. 10 has a difference in that no opening is separately formed in the pixel PX.

In the above description, the overlapping layer 125 receives the input signal IND via the voltage application line 125-1 from the outside, and the input signal IND has a constant positive voltage. In an example embodiment, the voltage application line 125-1 is separated from the driving voltage source supplying the driving voltage ELVDD to the organic light emitting diode OLED.

Hereinafter, a structure in which the overlapping layer 125 is connected to the first electrode or the second electrode of the third transistor T3 will be described with reference to FIG. 11 and FIG. 12.

FIG. 11 and FIG. 12 illustrate cross-sectional views of a portion of one pixel in an organic light emitting diode display according to an embodiment.

The embodiment of FIG. 11 and FIG. 12 is an embodiment that is similar to the embodiment of FIG. 6 to FIG. 8, except that the overlapping layer 125 is electrically connected to one of the electrodes of the third transistor T3. Unlike the cross-sectional views of FIG. 4, FIG. 5, etc., FIG. 11 and FIG. 12 mainly illustrate cross-sectional views of a characteristic portion of one pixel of an organic light emitting diode display.

First, the embodiment of FIG. 11 will be described.

Unlike FIG. 4 and FIG. 5, FIG. 11 does not show the barrier layer 111 and the buffer layer 112 disposed on the substrate 110. This shows that the barrier layer 111 and the buffer layer 112 may be omitted in some embodiments.

A structure shown in a right side of FIG. 11 is a sectional structure of the driving transistor T1 and the storage capacitor Cst disposed thereon, and a structure shown in a left side of FIG. 11 is a sectional structure of the third transistor T3 and the overlapping layer 125 overlapping the third transistor T3.

The structure shown in the right side of FIG. 11 will be described.

As shown in the right side of FIG. 11, the driving transistor T1 is formed by disposing the polycrystalline semiconductor layer 130 on the substrate 110, covering the first gate insulating film 141 thereon, and then forming the gate electrode G1 thereon. The channel, the first electrode, and the second electrode of the driving transistor T1 are formed on the polycrystalline semiconductor layer 130.

The storage capacitor Cst is formed in the pixel PX according to the present embodiment, and two electrodes of the storage capacitor Cst are formed as the gate electrode G1 of the driving transistor T1 and the extension of the storage line 126 that are insulated and overlaps each other. The second gate insulating film 142 disposed therebetween serves as a dielectric layer of the storage capacitor Cst.

The storage capacitor Cst is covered with the third gate insulating film 143, and the third gate insulating film 143 is covered with an interlayer insulating film 160. Unlike FIG. 4 and FIG. 5, in the embodiment of FIG. 11, since the fourth gate insulating film 144 is only partially formed, it is not formed on the storage capacitor Cst. In some embodiments, the fourth gate insulating film 144 may only be partially formed.

Referring to the structure shown in the left side of FIG. 11, the third transistor T3 and the overlapping layer 125 overlapping the third transistor T3 are shown.

The first gate insulating film 141 and the second gate insulating film 142 are sequentially stacked on the substrate 110. Thereafter, the overlapping layer 125 is disposed on the second gate insulating film 142. The third gate insulating film 143 is disposed on the overlapping layer 125. The oxide semiconductor layer 135 is disposed on the third gate insulating film 143. The fourth gate insulating film 144 is disposed on the oxide semiconductor layer 135, and the gate electrode G3 of the third transistor T3 is formed on the fourth gate insulating film 144. Here, the fourth gate insulating film 144 and the gate electrode G3 of the third transistor T3 may have the same planar shape.

The interlayer insulating film 160 is disposed on the gate electrode G3 of the third transistor T3, and the connecting auxiliary portion 75 for electrically connecting the first electrode S3 of the third transistor T3 and the overlapping layer 125 is formed on the interlayer insulating film 160. One end of the connecting auxiliary portion 75 is connected to the overlapping layer 125 through the opening 66, and the other end thereof is connected to the first electrode S3 of the third transistor T3 through the opening 66-1. The opening 66 penetrates the third gate insulating film 143 and the interlayer insulating film 160 to expose the overlapping layer 125, and the opening 66-1 penetrates the interlayer insulating film 160 to expose the first electrode S3.

Meanwhile, in some embodiments, the overlapping layer 125 may be connected to the second electrode D3 of the third transistor T3, which is shown in FIG. 12.

FIG. 12 is substantially the same as FIG. 11, except that the connecting auxiliary portion 75 electrically connected to the overlapping layer 125 is connected to the second electrode D3 of the third transistor T3 instead of the first electrode S3 thereof.

As in the embodiment of FIG. 6, in FIG. 11 and FIG. 12, the overlapping layer 125 is electrically connected to one electrode of the third transistor T3 overlapping the overlapping layer 125, thereby stabilizing characteristics of the oxide semiconductor layer 135.

In the above description, the overlapping layer 125 overlaps the third transistor T3.

Hereinafter, an embodiment in which the overlapping layer 125 overlaps the fourth transistor T4 or the seventh transistor T7 of the switching transistor group including the oxide semiconductor layer will be described.

First, an embodiment in which the overlapping layer 125 overlaps the fourth transistor T4 will be described with reference to FIG. 13.

Figure 13:
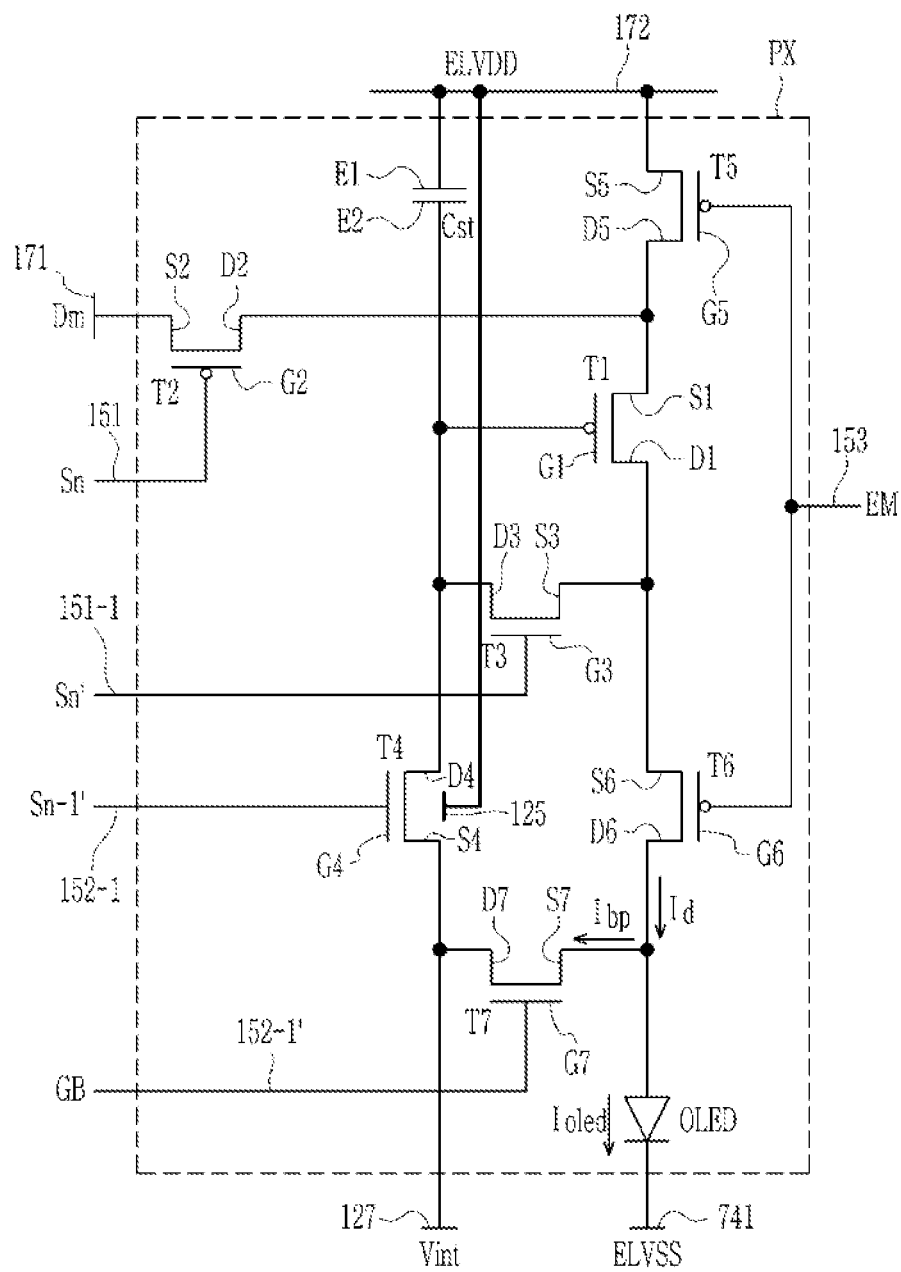
FIG. 13 illustrates an equivalent circuit diagram of one pixel of an organic light emitting diode display according to an embodiment.

FIG. 13 illustrates an equivalent circuit diagram of one pixel of an organic light emitting diode display according to an embodiment.

Compared with FIG. 1, in FIG. 13, the overlapping layer 125 does not overlap the third transistor T3 but overlaps the fourth transistor T4. Except for this, the structure of the pixel of FIG. 13 is the same as that of FIG. 1. The driving voltage ELVDD is applied to the overlapping layer 125. As a result, the fourth transistor T4 including the oxide semiconductor layer has a stable channel characteristic due to the overlapping layer 125 to which the driving voltage ELVDD is applied, thereby reducing the leakage current.

In addition, unlike the embodiment of FIG. 13, the overlapping layer 125 may be connected to one electrode of a transistor overlapping the overlapping layer 125, or may be applied with a predetermined positive voltage instead of the driving voltage ELVDD.

Further, in some embodiments, the embodiments of FIG. 1 and FIG. 13 may be applied together to include both an overlapping layer 125 overlapping the third transistor T3 and an overlapping layer 125 overlapping the fourth transistor T4.

Hereinafter, an embodiment in which the overlapping layer 125 overlaps the seventh transistor T7 will be described with reference to FIG. 14.

Figure 14:
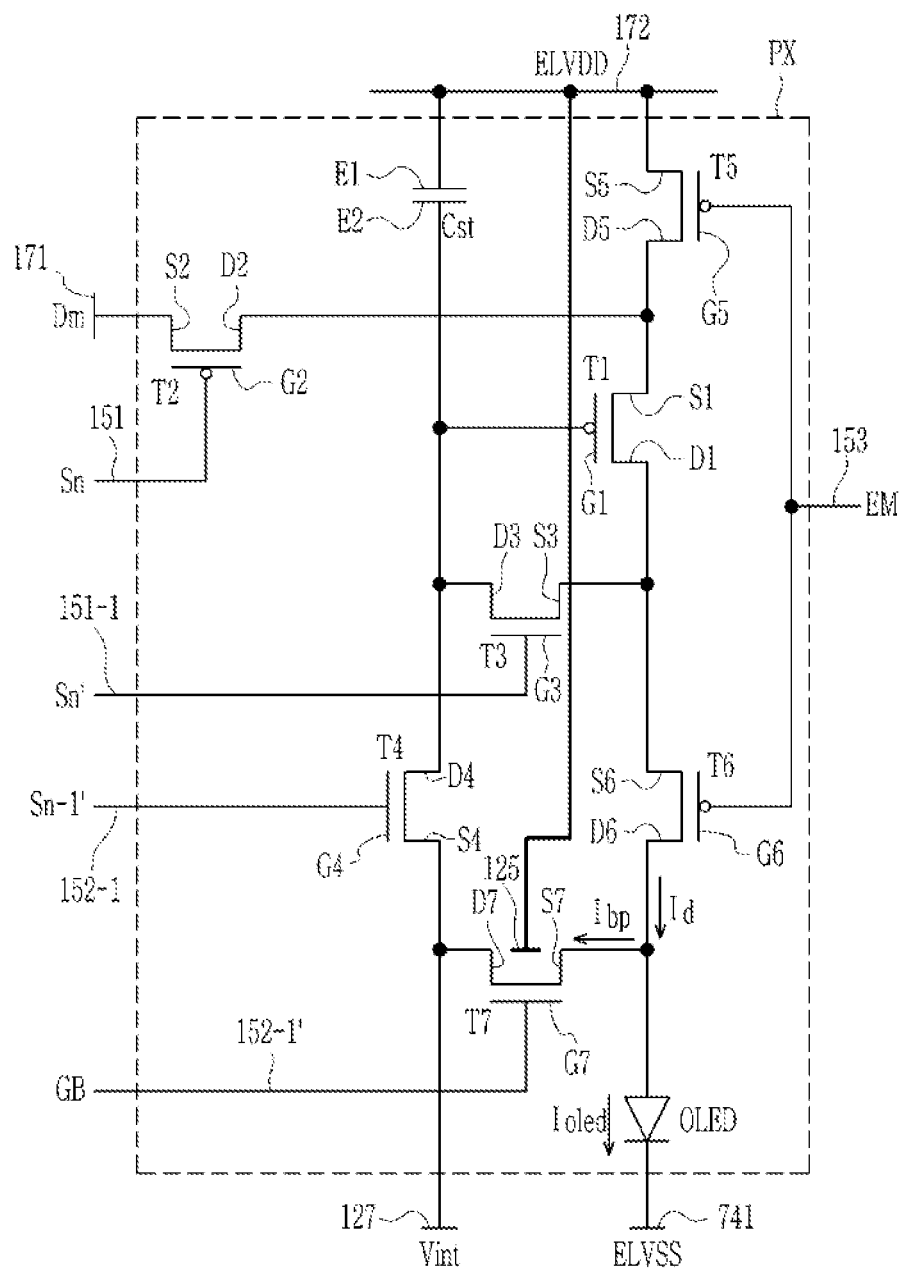
FIG. 14 illustrates an equivalent circuit diagram of one pixel of an organic light emitting diode display according to an embodiment.

FIG. 14 illustrates an equivalent circuit diagram of one pixel of an organic light emitting diode display according to an embodiment.

Compared with FIG. 1, in FIG. 14, the overlapping layer 125 does not overlap the third transistor T3 but overlaps the seventh transistor T7. Except for this, the structure of the pixel of FIG. 14 is the same as that of FIG. 1. The driving voltage ELVDD is applied to the overlapping layer 125. As a result, the seventh transistor T7 including the oxide semiconductor layer has a stable channel characteristic due to the overlapping layer 125 to which the driving voltage ELVDD is applied, thereby reducing the leakage current.

In addition, unlike the embodiment of FIG. 14, the overlapping layer 125 may be connected to one electrode of a transistor overlapping the overlapping layer 125, or may be applied with a predetermined positive voltage instead of the driving voltage ELVDD.

Further, in some embodiments, the embodiments of FIG. 1 and FIG. 14 may be applied together to include both an overlapping layer 125 overlapping the third transistor T3 and an overlapping layer 125 overlapping the seventh transistor T7. Moreover, the embodiments of FIG. 1, FIG. 13, and FIG. 14 may be applied together to include all of an overlapping layer 125 overlapping the third transistor T3, an overlapping layer 125 overlapping the fourth transistor T4, and an overlapping layer 125 overlapping the seventh transistor T7.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

| <Description of symbols> | |
|---|---|
| 110: substrate | 111: barrier layer |
| 112: buffer layer | 125: overlapping layer |
| 125-1: voltage application line for overlapping layer | |
| 126: storage line | |
| 155: gate electrode | |
| 130: polycrystalline semiconductor layer | |
| 131: first polycrystalline semiconductor layer | |
| 132: second polycrystalline semiconductor layer | |
| 133: third polycrystalline semiconductor layer | |
| 135: oxide semiconductor layer | |
| 141: first gate insulating film | 142: second gate insulating film |
| 143: third gate insulating film | 144: fourth gate insulating film |
| 160: interlayer insulating film | 171: data line |
| 172: driving voltage line | 180: passivation |
| 71: first data connecting member | |
| 72: second data connecting member | |
| 73: third data connecting member | |
| 74: fourth data connecting member | |
| 75: connecting auxiliary portion | 151: scan line |
| 151-1: main inversion scan line | 152-1: previous inversion scan line |
| 152-1': bypass control line | 153: light emission control line |
| 127: initializing voltage line | 741: common voltage line |
| 56: opening | Cst: storage capacitor |
| OLED: organic light emitting diode | PX: pixel |
| Sn: scan signal | Sn': inversion scan signal |
| Sn-1: line scan signal | Sn-1': previous inversion scan signal |
| 61, 61-1, 62, 63, 63-1, 64, 64-1, 65, | |
| 65-1, 66, 66-1, 67, 68: opening | |

What is claimed is:

1. An organic light emitting diode display, comprising:
a first thin film transistor disposed on a substrate, the first thin film transistor including a channel formed in a polycrystalline semiconductor layer;
a second thin film transistor disposed on the substrate, the second thin film transistor including a channel formed in an oxide semiconductor layer;
an organic light emitting diode electrically connected to the first thin film transistor;
a storage capacitor having a first electrode and a second electrode, wherein the second electrode of the storage capacitor is electrically connected to a gate electrode of the first thin film transistor; and
an overlapping layer overlapping the oxide semiconductor layer in a plan view and receiving a positive voltage,
wherein the overlapping layer is disposed under the oxide semiconductor layer, and
wherein the oxide semiconductor layer is positioned higher than the gate electrode of the first thin film transistor and the second electrode of the storage capacitor.

2. The organic light emitting diode display of claim 1, wherein the organic light emitting diode receives an output current flowing through the first thin film transistor and emits light.

3. The organic light emitting diode display of claim 2, wherein the storage capacitor maintains a voltage of the gate electrode of the first thin film transistor.

4. The organic light emitting diode display of claim 3, wherein a driving voltage is applied to the first electrode of the storage capacitor and the overlapping layer, and
wherein the driving voltage is applied to the overlapping layer as the positive voltage.

5. The organic light emitting diode display of claim 3, further comprising:
a voltage application line supplying the positive voltage to the overlapping layer.

6. The organic light emitting diode display of claim 3, wherein the second thin film transistor includes a gate electrode electrically connected to the overlapping layer.

7. The organic light emitting diode display of claim 3, wherein the second thin film transistor includes a first electrode electrically connected to the overlapping layer and the first thin film transistor.

8. The organic light emitting diode display of claim 3, wherein the second thin film transistor includes a second electrode electrically connected to the overlapping layer and the storage capacitor.

* * * * *